United States Patent
Hikmet et al.

(10) Patent No.: US 12,227,686 B2
(45) Date of Patent: Feb. 18, 2025

(54) CERAMIC PHOSPHOR ARRAY

(71) Applicant: SIGNIFY HOLDING B.V., Eindhoven (NL)

(72) Inventors: Rifat Ata Mustafa Hikmet, Eindhoven (NL); Ties Van Bommel, Horst (NL); Oliver Francis Burke, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 226 days.

(21) Appl. No.: 18/011,218

(22) PCT Filed: Jun. 18, 2021

(86) PCT No.: PCT/EP2021/066644
§ 371 (c)(1),
(2) Date: Dec. 19, 2022

(87) PCT Pub. No.: WO2021/259800
PCT Pub. Date: Dec. 30, 2021

(65) Prior Publication Data
US 2023/0235222 A1  Jul. 27, 2023

(30) Foreign Application Priority Data
Jun. 25, 2020 (EP) .................................... 20182147

(51) Int. Cl.
F21V 9/32 (2018.01)
C09K 11/77 (2006.01)
F21V 9/38 (2018.01)
H01L 33/50 (2010.01)

(52) U.S. Cl.
CPC ............ *C09K 11/7774* (2013.01); *F21V 9/32* (2018.02); *F21V 9/38* (2018.02); *H01L 33/50* (2013.01)

(58) Field of Classification Search
CPC ......... C09K 11/7774; F21V 9/32; F21V 9/38; H01L 33/50; F21S 41/16; F21S 41/176
See application file for complete search history.

(56) References Cited

U.S. PATENT DOCUMENTS

2013/0250544 A1   9/2013   Zink et al.
2015/0049457 A1   2/2015   Kroell
(Continued)

OTHER PUBLICATIONS

Zhang, Mei, et al., "Optical Properties of BA2SIO4:EU2+ Phosphor for Green Light-Emitting Diode (LED)," Science Direct, Materials Research Bulletin, 42, 2007 (7 Pages).
Alvani, A.A. Sabbagh, et al., "Effects of Dopant Concentrations on Phosphorescence Properties of EU/DY-Doped SR3MGSI2O8," Journal of Luminescence, 114, 2005 (6 Pages).
(Continued)

*Primary Examiner* — Elmito Breval

(57) ABSTRACT

The invention provides a light generating device (1000) comprising a light source (10) and a luminescent element (20), wherein:—the light source (10) is configured to generate the first radiation (11); wherein the light source (10) comprises a laser light source;—the luminescent element (20) comprises (i) a plurality of element bodies (200) and (ii) a thermally conductive support (400); wherein the plurality of element bodies (200) comprises a plurality of first bodies (210) and a plurality of second bodies (220);—the plurality of first bodies (210) comprise a luminescent material (50), wherein the luminescent material (50) is configured to convert at least part of first radiation (11), selected from one or more of UV radiation and visible radiation, into luminescent material light (51); wherein the first bodies have a first thermal conductivity K1; wherein the first bodies (210) are configured in a light receiving relationship with the light source (10);—the plurality of second bodies (220), different from the first bodies (210) are light transmissive for one or more wavelengths of the first radiation (11) and the luminescent material light (51); wherein the second bodies (220) have a second thermal conductivity K2, wherein
(Continued)

K2≥0.2*K1;—the plurality of first bodies (210) and the plurality of second bodies (220) are configured in a 2D arrangement (205), wherein for a plurality of second bodies (220) applies that they are configured adjacent to different first bodies (210); and—the plurality of first bodies (210) and second bodies (220) are configured in thermal contact with the thermally conductive support (400).

15 Claims, 9 Drawing Sheets

(56) References Cited

U.S. PATENT DOCUMENTS

| | | |
|---|---|---|
| 2015/0204492 A1 | 7/2015 | Bichler et al. |
| 2016/0097494 A1 | 4/2016 | Su et al. |
| 2017/0254489 A1 | 9/2017 | Hikmet et al. |
| 2017/0356613 A1 | 12/2017 | Van Bommel et al. |
| 2018/0156409 A1 | 6/2018 | Schwaiger |
| 2018/0371315 A1 | 12/2018 | Hofmann et al. |
| 2019/0067534 A1 | 2/2019 | Mazuir et al. |
| 2019/0285248 A1 | 9/2019 | Kamiya et al. |

OTHER PUBLICATIONS

Li, Shuxing, et al., "CAISIN3:EU2+ Translucent Ceramic: a Promising Robust and Efficient Red Color Converter for Solid State Laster Displays and Lighting," Journal of Materials Chemistry C, 2016 (9 Pages).

(I)

(II)

CERAMIC PHOSPHOR ARRAY

CROSS-REFERENCE TO PRIOR APPLICATIONS

This application is the U.S. National Phase application under 35 U.S.C. § 371 of International Application No. PCT/EP2021/066644, filed on Jun. 18, 2021, which claims the benefit of European Patent Application No. 20182147.7, filed on Jun. 25, 2020. These applications are hereby incorporated by reference herein.

FIELD OF THE INVENTION

The invention relates to a light generating device comprising a luminescent element. Further, the invention relates to a luminaire, or a lamp, or a projector device, comprising such light generating device.

BACKGROUND OF THE INVENTION

Ceramic wavelength-conversion plates and light sources including the same are known in the art. US2013/0250544, for instance, describes a wavelength-conversion plate, comprising a converter, said converter comprising a first ceramic material capable of converting incident primary light to secondary light; a reflector coupled to said converter, said reflector comprising a second ceramic material capable of reflecting secondary light emitted by said converter; and an interface between said converter and said reflector, wherein said second ceramic material abuts said first ceramic material over at least about 50% of said interface.

SUMMARY OF THE INVENTION

While white LED sources can give an intensity of e.g. up to about 300 lm/mm$^2$; static phosphor converted laser white sources can give an intensity even up to about 20.000 lm/mm$^2$. Ce doped garnets (e.g. YAG, LuAG) may be the most suitable luminescent convertors which can be used for pumping with blue laser light as the garnet matrix has a very high chemical stability. Further, at low Ce concentrations (e.g. below 0.5%) temperature quenching may only occur above about 200° C. Furthermore, emission from Ce has a very fast decay time so that optical saturation can essentially be avoided. Assuming e.g. a reflective mode operation, blue laser light may be incident on a phosphor. This may in embodiments realize almost full conversion of blue light, leading to emission of converted light. It is for this reason that the use of garnet phosphors with relatively high stability and thermal conductivity is suggested. However, also other phosphors may be applied. Heat management may remain an issue when extremely high-power densities are used.

High brightness light sources can be used in applications such as projection, stage-lighting, spot-lighting and automotive lighting. For this purpose, laser-phosphor technology can be used wherein a laser provides laser light and e.g. a (remote) phosphor converts laser light into converted light. The phosphor may in embodiments be arranged on or inserted in a heatsink for improved thermal management and thus higher brightness.

One of the problems that may be associated with such (laser) light sources is the heat management of the ceramic phosphor. In order to induce good heat sinking of the phosphor, especially when it is used in the reflective mode, it may be soldered onto the heat sink. In order to obtain high reflectivity, the phosphor may be coated with a reflective layer, such as an aluminum layer or a silver layer. Especially, the (highly) reflective layer may have a good adhesion to the phosphor and can be attached, such as soldered, in a reliable way to the heat sink (or other thermally conductive element). However, a relatively high optical load, especially when not substantially uniformly provided to the ceramic phosphor, may lead to failures during the operation of the device. For example, crack formation and/or delamination of the phosphor ceramic may occur.

Hence, it is an aspect of the invention to provide an alternative luminescent element, which preferably further at least partly obviates one or more of above-described drawbacks. The present invention may have as object to overcome or ameliorate at least one of the disadvantages of the prior art, or to provide a useful alternative.

In a first aspect, the invention provides a luminescent element ("element") comprising (i) a plurality of element bodies ("bodies") and (ii) a thermally conductive support (or "thermally conductive element"). In embodiments, one or more, especially a plurality, of the plurality of element bodies, comprise a luminescent material, wherein the luminescent material is configured to convert at least part of first radiation, selected from one or more of UV radiation and visible radiation, into luminescent material light (which may especially be in the visible wavelength range). Especially, the plurality of element bodies are configured in a 2D arrangement. Further, especially, the plurality of element bodies are configured in thermal contact with the thermally conductive support. Even more especially, in embodiments the plurality of element bodies comprises one or more, especially a plurality, of first bodies and one or more, especially a plurality, of second bodies. Especially, the second bodies are different from the first bodies. In specific embodiments, the plurality of first bodies comprise a luminescent material, wherein the luminescent material is configured to convert at least part of first radiation, selected from one or more of UV radiation and visible radiation, into luminescent material light. Especially, the first bodies have a first thermal conductivity K1. Further, in embodiments the plurality of second bodies are light transmissive for one or more wavelengths of the first radiation and the luminescent material light. Especially, the second bodies have a second thermal conductivity K2, wherein in specific embodiments K2≥0.2*K1. In further specific embodiments, the plurality of first bodies and the plurality of second bodies are configured in a 2D arrangement, wherein for a plurality of second bodies applies that they are configured adjacent to different first bodies. As indicated above, the plurality of first bodies and second bodies are configured in thermal contact with the thermally conductive support. Hence, in specific embodiments the invention provides a luminescent element comprising (i) a plurality of element bodies and (ii) a thermally conductive support, wherein one or more, especially a plurality, of the plurality of element bodies comprise a luminescent material, wherein the luminescent material is configured to convert at least part of first radiation, selected from one or more of UV radiation and visible radiation, into luminescent material light, and wherein the plurality of element bodies are configured in thermal contact with the thermally conductive support. More especially, the invention provides a luminescent element comprising (i) a plurality of element bodies and (ii) a thermally conductive support, wherein: (a) the plurality of element bodies comprises a plurality of first bodies and a plurality of second bodies; (b) the plurality of first bodies comprise a luminescent material, wherein the luminescent material is configured to convert at least part of first radiation, selected from one or more of UV radiation and visible radiation, into luminescent material light; wherein the first bodies have a first thermal conductivity K1; (c) the plurality of second bodies, different from the first bodies are light transmissive for one or more wavelengths of the first radiation and the luminescent material light; wherein the second bodies have a second thermal conductivity K2, wherein K2≥0.2*K1; (d) the plurality of first bodies and the plurality of second bodies are configured in a 2D arrangement, wherein for a plurality of second bodies applies that they are configured adjacent to different first bodies; and (e) the plurality of first bodies and second bodies are configured in thermal contact with the thermally conductive support. Especially, in yet a further aspect the invention provides a light generating device comprising a light source and the luminescent element. Especially, the light source is configured to generate the first radiation. In specific embodiments, the light source comprises a laser light source. One or more of the element bodies, in specific embodiments at least the first bodies, are configured in a light receiving relationship with the light source. In specific embodiments, the plurality of second bodies do not comprise a luminescent material. Preferably, the plurality of first bodies and/or the plurality of second bodies are discrete bodies, i.e. discrete elements.

With such luminescent element, thermal load may be better handled. The bodies may be in thermal contact with the thermally conductive element. When irradiated with (laser) radiation, part of the heat that may be generated, may be dissipated via the thermally conducive support. Further, would delamination occur, this may occur only locally at the specific body. This may not have impact on the other element bodies. Likewise, would a crack occur, this may occur only locally at the specific element body; this may not have impact on the other bodies. Further, when adding non-luminescent bodies between luminescent bodies, thermal dissipation pathways may be increased. This may lead to an even better thermal management. Adding non-luminescent bodies between luminescent bodies may also improve distribution of the excitation light when the luminescent element is irradiated with excitation light. Yet further, when using different bodies for different luminescent materials, the luminescent element may also facilitate color mixing.

As indicated above, the luminescent element comprises (i) a plurality of element bodies and (ii) a thermally conductive support.

The bodies may especially be selected from single crystalline bodies and ceramic bodies. The latter may be more easily made than the former, while they nevertheless may have good optical and/or thermal properties. Hence, in embodiments the bodies may be ceramic bodies. However, in specific embodiments also a combination of single crystalline bodies and ceramic bodies may be applied. Especially, the luminescent body comprises a ceramic luminescent body. Hence, in specific embodiments the luminescent body is defined by a ceramic luminescent material. Therefore, in specific embodiments the luminescent material is a luminescent material that can be provided a ceramic luminescent body.

Many of the below described luminescent materials, especially the garnet materials, can be provided as ceramics (ceramic body or ceramic slab). At least this applies for the above described $A_3B_5O_{12}:Ce$, or with an alternative formula described $A_3B'_2C''_3O_{12}:Ce$ (see also below).

Ceramic bodies are known in the art. Especially, the ceramic material may be obtainable by a sintering process and/or a hot pressing process, optionally followed by an annealing in an (slightly) oxidizing atmosphere. The term "ceramic" especially relates to an inorganic material that is—amongst others—obtainable by heating a (poly crystalline) powder at a temperature of at least 500° C., especially at least 800° C., such as at least 1000° C., like at least 1400° C., under reduced pressure, atmospheric pressure or high pressure, such as in the range of $10^{-8}$ to 500 MPa, such as especially at least 0.5 MPa, like especially at least 1 MPa, like 1 to about 500 MPa, such as at least 5 MPa, or at least 10 MPa, especially under uniaxial or isostatic pressure, especially under isostatic pressure. A specific method to obtain a ceramic is hot isostatic pressing (HIP), whereas the HIP process may be a post-sinter HIP, capsule HIP or combined sinter-HIP process, like under the temperature and pressure conditions as indicate above. The ceramic obtainable by such method may be used as such, or may be further processed (like polishing). A ceramic especially has density that is at least 90% (or higher, see below), such as at least 95%, like in the range of 97-100%, of theoretical density (i.e. the density of a single crystal). A ceramic may still be polycrystalline, but with a reduced, or strongly reduced volume between grains (pressed particles or pressed agglomerate particles). The heating under elevated pressure, such as HIP, may e.g. be performed in an inert gas, such as comprising one or more of $N_2$ and argon (Ar). Especially, the heating under elevated pressures is preceded by a sintering process at a temperature selected from the range of 1400-1900° C., such as 1500-1800° C. Such sintering may be performed under reduced pressure, such as at a pressure of $10^{-2}$ Pa or lower. Such sintering may already lead to a density of in the order of at least 95%, even more especially at least 99%, of theoretical density. After both the pre-sintering and the heating, especially under elevated pressure, such as HIP, the density of the light transmissive body can be close to the density of a single crystal. However, a difference is that grain boundaries are available in the light transmissive body, as the light transmissive body is polycrystalline. Such grain boundaries can e.g. be detected by optical microscopy or SEM. Hence, herein the light transmissive body especially refers to a sintered polycrystalline having a density substantially identical to a single crystal (of the same material). Such body may thus be highly transparent for visible light (except for the absorption by the light absorbing species such as especially $Ce^{3+}$).

The bodies may have cross-section selected from e.g. circular, triangular, square, rectangular (but not square), pentagonal, hexagonal, octagonal, decagonal, etc. Here, the cross-section especially refers to a cross-section perpendicular to the height and/or parallel to the thermally conductive support. Especially, in embodiments the height (H) is selected from the range of 30 µm-10 mm. Even more especially, the height may be selected from the range of 50 µm-2 mm, such as especially 50 µm-1 mm, such as 0.5 mm or smaller. When the luminescent body has a length and a width, like in (non-square) rectangular embodiments, the length and width may have a ratio selected from the range of 1:5-5:1, such as 1:2-2:1. In embodiments, the bodies have a lateral dimension width or length (W or L) or diameter (D) and a thickness or height (H). In embodiments, (i) D≥H or (ii) and W≥H and/or L≥H.

Within the plurality of bodies, two or more bodies may have essentially the same dimensions. Alternatively or additionally, within the plurality of bodies, two or more bodies may have different dimensions. In embodiments, all bodies within the plurality of bodies have essentially the same dimensions. In yet other embodiments, within the plurality of bodies have the same dimensions there are n subsets, wherein each subset comprises a plurality of bodies having essentially the same dimensions, but wherein bodies of different subsets have one or more mutually differing dimension. The number n of subsets may be selected from the range of 2-8, such as 2-4. In specific embodiments, however, the plurality of element bodies have identical cross-sectional dimensions.

The plurality of bodies may comprise at least 4 bodies, even more especially at least 8. In embodiments, the number of bodies may be selected from the range of 8-900, such as 8-400, though even more may be possible. Hence, when two or more different types of element bodies are applied, in embodiments the total number of bodies may be up to about 900, such as up to about 400.

One or more of the bodies, especially a plurality of the bodies, comprise a luminescent material. The term "luminescent material" herein especially relates to inorganic luminescent materials, which are also sometimes indicated as phosphors. These terms are known to the person skilled in the art.

In embodiments, quantum dots and/or organic dyes may be applied, and may optionally be embedded in transmissive matrices like e.g. polymers, like PMMA, or polysiloxanes, etc. etc . . . Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore, the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content. Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nanowires, etcetera. Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170. Quantum confinement structures may thus also be converter elements. The organic luminescent materials, such as afore-mentioned dyes, or more especially specific (functional) groups thereof, may thus also be converter elements. Elements like (trivalent) Ce and divalent Eu are in the art also indicates as activators or activator elements or "dopants". Hence, especially the luminescent material is or comprises a converter element.

As indicated above, the light generating device especially further comprises a luminescent material configured to convert at least part of the light source light into luminescent material light having an emission band having wavelengths in one or more of (a) the green spectral wavelength range and (b) the yellow spectral wavelength range.

The term "luminescent material" especially refers to a material that can convert first radiation, especially (one or more of UV radiation and) blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion. In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex}<\lambda_{em}$), though in specific embodiments the luminescent material may comprise down-converter luminescent material, i.e. radiation of a larger wavelength is converted into radiation with a smaller wavelength ($\lambda_{ex}>\lambda_{em}$). In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials. The term "luminescent material" herein may also refer to a material comprising a luminescent material, such as a light transmissive host comprising the luminescent material.

Especially, the luminescent material is configured to convert at least part of the light source light into luminescent material light having an emission band having wavelengths in one or more of (a) the green spectral wavelength range and (b) the yellow spectral wavelength range, wherein the luminescent material comprises a (garnet) luminescent material of the type $A_3B_5O_{12}$:Ce, wherein A comprises one or more of Y, La, Gd, Tb and Lu, and wherein B comprises one or more of Al, Ga, In and Sc. Hence, the luminescent material light may e.g. green light or yellow light (or in specific embodiments even orange (dependent upon the composition of the garnet and cerium concentration)). However, other embodiments are also possible, see below. In embodiments, 0.05-10% of the A elements comprise Ce, even more especially 0.05-5%, such as 0.1-5%. Especially, embodiments, 0.1-3% of the A elements comprise Ce, such as up to 2%, like selected from the range of 0.1-1.5%, such as at least above 0.5%.

Especially, a luminescent material comprises conversion material or is a conversion material. A luminescent material converts light from a light source, such as the light source light, into secondary light (here the luminescent material light). The luminescent material may comprise an organic group that converts the light, or a molecule that converts the light, or an inorganic group that converts the light, etc. Such groups (or molecule) may be indicated as converter element. The garnet type material as indicated above, comprises cerium (Ce) as converter element. Cerium comprising garnets are well known in the art.

Hence, in specific embodiments the luminescent material comprises a luminescent material of the type $A_3B_5O_{12}$:Ce, wherein A in embodiments comprises one or more of Y, La, Gd, Tb and Lu, especially (at least) one or more of Y, Gd, Tb and Lu, and wherein B in embodiments comprises one or more of Al, Ga, In and Sc. Especially, A may comprise one or more of Y, Gd and Lu, such as especially one or more of Y and Lu. Especially, B may comprise one or more of Al and Ga, more especially at least Al, such as essentially entirely Al. Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

In embodiments, the luminescent material (thus) comprises $A_3B_5O_{12}$ wherein in specific embodiments at maximum 10% of B—O may be replaced by Si—N.

In specific embodiments the luminescent material comprises $(Y_{x1-x2-x3}A'_{x2}Ce_{x3})_3(Al_{y1-y2}B'_{y2})_5O_{12}$, wherein x1+x2+x3=1, wherein x3>0, wherein 0<x2+x3≤0.2, wherein y1+y2=1, wherein 0≤y2≤0.2, wherein A' comprises one or more elements selected from the group consisting of lanthanides, and wherein B' comprises one or more elements selected from the group consisting of Ga, In and Sc. In embodiments, x3 is selected from the range of 0.001-0.1. In the present invention, especially x1>0, such as >0.2, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O. As indicated above, in specific embodiments x3 may be selected from the range of 0.001-0.04. Especially, such luminescent materials may have a suitable spectral distribution (see however below), have a relatively high efficiency, have a relatively high thermal stability, and allow a high CRI (in combination with the light source light and the second light source light (and the optical filter)). Hence, in specific embodiments A may be selected from the group consisting of Lu and Gd. Alternatively or additionally, B may comprise Ga. Hence, in embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein 0<x2+x3≤0.1, and wherein 0≤y2≤0.1. Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1-x3}Ce_{x3})_3Al_5O_{12}$, wherein x1+x3=1, and wherein 0<x3≤0.2, such as 0.001-0.1.

In specific embodiments, the light generating device may only include luminescent materials selected from the type of cerium comprising garnets. In even further specific embodiments, the light generating device includes a single type of luminescent materials, such as $(Y_{x1-x2-x3}A'_{x2}Ce_{x3})_3(Al_{y1-y2}B'_{y2})_5O_{12}$. Hence, in specific embodiments the light generating device comprises luminescent material, wherein at least 85 weight %, even more especially at least about 90 wt. %, such as yet even more especially at least about 95 weight % of the luminescent material comprises $(Y_{x1-x2-x3}A'_{x2}Ce_{x3})_3(Al_{y1-y2}B'_{y2})_5O_{12}$. Here, wherein A' comprises one or more elements selected from the group consisting of lanthanides, and wherein B' comprises one or more elements selected from the group consisting of Ga In and Sc, wherein x1+x2+x3=1, wherein x3>0, wherein 0<x2+x3≤0.2, wherein y1+y2=1, wherein 0≤y2≤0.2. Especially, x3 is selected from the range of 0.001-0.1. Note that in embodiments x2=0. Alternatively or additionally, in embodiments y2=0.

In specific embodiments, A may especially comprise at least Y, and B may especially comprise at least Al.

The garnet type luminescent material may also described with an alternative formula $A_3B'_2C''_3O_{12}$. Here, A may comprise one or more of (i) rare earth ions, such as one or more selected from $Y^{3+}$, $Lu^{3+}$, $Gd^{3+}$, $Tb^{3+}$, $La^{3+}$, and (ii) divalent cations, such as $Ca^{2+}$. Here, B may comprise one or more of (i) trivalent cations, such as one or more of $Al^{3+}$, $Ga^{3+}$, $Sc^{3+}$, $Sb^{3+}$, and $In^{3+}$, and (ii) divalent cations, such as one or more of $Mg^{2+}$ and $Mn^{2+}$. Here, C may comprise one or more of (i) trivalent cations, such as one or more of $Ga^{3+}$ and $Al^{3+}$, (ii) divalent cations, such as $Mn^{2+}$, and (iii) tetravalent cations, such as one or more of $Si^{4+}$ and $Ge^{4+}$. With such ions, the garnet crystal structure can be maintained. Other substitutions than mentioned may also be possible.

Alternatively or additionally, the luminescent material may e.g. be $M_2Si_5N_8$:$Eu^{2+}$ and/or MAlSiN$_3$:$Eu^{2+}$ and/or $Ca_2AlSi_3O_2N_5$:$Eu^{2+}$, etc., wherein M comprises one or more of Ba, Sr and Ca, especially in embodiments at least Sr. In specific embodiments, the first luminescent may comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in CaAlSiN$_3$:Eu, the correct formula could be $(Ca_{0.98}Eu_{0.02})$AlSiN$_3$. Divalent europium will in general replace divalent cations, such as the above divalent alkaline earth cations, especially Ca, Sr, or Ba. The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material $(Ba,Sr,Ca)_2Si_5N_8$:Eu can also be indicated as $M_2Si_5N_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as $Ba_{1.5}Sr_{0.5}Si_5N_8$:Eu (i.e. 75% Ba; 25% Sr). Here, Eu is introduced and replaces at least part of M, i.e. one or more of Ba, Sr, and Ca). Likewise, the material $(Ba,Sr,Ca)AlSiN_3$:Eu can also be indicated as $MAlSiN_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Eu in the above indicated luminescent materials is substantially or only in the divalent state, as is known to the person skilled in the art. Hence, such nitride luminescent materials may also be or comprise converter elements, here especially $Eu^{2+}$.

Especially, the luminescent material may be an inorganic luminescent material, such as one or more of the above-described trivalent cerium or divalent europium comprising oxides, oxynitrides, or nitrides.

The luminescent material is configured to convert at least part of first radiation (selected from one or more of UV radiation and visible radiation), into luminescent material light. Especially, in embodiments the luminescent material may be configured to convert at least part of blue light (as radiation) into luminescent material light. Especially when blue light is partly converted, the blue light may be used as source of blue light (for the device light) and as excitation light that can be converted by the luminescent material. The first radiation may especially be provided by a (solid state) light source, see further below.

The terms "visible", "visible light" or "visible emission" and similar terms refer to light having one or more wavelengths in the range of about 380-780 nm. Herein, UV may especially refer to a wavelength selected from the range of 200-380 nm. The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to (at least) visible light. The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The term "cyan" may refer to one or more wavelengths selected from the range of about 490-520 nm. The term "amber" may refer to one or more wavelengths selected from the range of about 585-605 nm, such as about 590-600 nm.

In embodiments, the plurality of element bodies comprises one or more, especially a plurality of, first bodies and one or more, especially a plurality of, second bodies. The phrase "plurality of first bodies and a plurality of second bodies", and similar phrases, do not exclude the presence of third bodies or even further bodies. In general, however, such further bodies are variants on the first bodies or on the second bodies, and may be considered as such, respectively. Hence, embodiments of the invention will further be explained especially in relation to a plurality of first bodies and a plurality of second bodies.

Basically, in embodiments the first bodies comprise the luminescent material and the second bodies are light transmissive (and may essentially not comprise luminescent material (that is excitable by the light source light that may be used to excite the luminescent material in the first bodies). Hence, the second bodies may in embodiments highly transparent, and may thus only have relatively low abundance of luminescent material or other light absorbing materials.

Especially, the plurality of first bodies comprise a luminescent material, wherein the luminescent material is configured to convert at least part of first radiation, selected from one or more of UV radiation and visible radiation, into luminescent material light. Examples of luminescent materials are described above. In specific embodiments, the first bodies comprise one or more of single crystals and ceramic bodies, wherein the luminescent material comprises a luminescent material of the type $A_3B_5O_{12}$:Ce, wherein A comprises one or more of Y, La, Gd, Tb and Lu, and wherein B comprises one or more of Al, Ga, In and Sc.

In specific embodiments, the first bodies all comprise a single type of luminescent material. Alternatively, in embodiments one or more of the first bodies comprise two or more different luminescent materials. Yet, alternatively or additionally, for two or more of the first bodies may apply that they mutually comprise different luminescent material. For instance, one or more bodies may have a luminescent material that provides luminescence in the yellow spectral range, and one or more other bodies may have a luminescent material that provides luminescence in the red spectral range. Especially, in embodiments the plurality of first bodies comprises a first subset of first bodies and a second subset of first bodies, wherein the first subset of first bodies comprise a first luminescent material and wherein the second subset of first bodies comprises a second luminescent material, different from the first luminescent material.

Different luminescent material may be configured to generate luminescent material light having different color points. In specific embodiments, colors or color points of a first type of light and a second type of light may be different when the respective color points of the first type of light and the second type of light differ with at least 0.01 for u' and/or with least 0.01 for v', even more especially at least 0.02 for u' and/or with least 0.02 for v'. In yet more specific embodiments, the respective color points of first type of light and the second type of light may differ with at least 0.03 for u' and/or with least 0.03 for v'. Here, u' and v' are color coordinate of the light in the CIE 1976 UCS (uniform chromaticity scale) diagram.

Further, the first bodies may have a first thermal conductivity K1. When there are different types of first bodies, such as first bodies comprising different luminescent materials, the thermal conductivity may be a weight averaged thermal conductivity. When al first bodies have essentially the same shapes and dimensions, the thermal conductivity may be an area averaged thermal conductivity.

Further, in embodiments the plurality of second bodies are thus different from the first bodies. Especially, the second bodies are light transmissive for one or more wavelengths of the first radiation and the luminescent material light. Especially, they are at least light transmissive for part of the luminescent material light. Would the luminescent material light have a peak wavelength and/or a dominant wavelength, especially the second bodies may be light transmissive for light having a wavelength identical to this peak wavelength and/or dominant wavelength. Hence, the phrase "different from the first bodies", and similar phrases, may especially indicate that one or more of the optical properties of the first bodies differ from those of the second bodies. Especially, the latter is essentially non-luminescent, i.e. the plurality of second bodies do not comprise a luminescent material. Especially, the chemical composition of the plurality of first bodies is different from that of the plurality of second bodies. However, both may substantially be transmissive for the luminescent material light.

The transmission of the second bodies for luminescence wavelengths (of the luminescent material light) may be at least 80%/cm, such as at least 90%/cm, even more especially at least 95%/cm, such as at least 98%/cm, such as at least 99%/cm. This implies that e.g. a 1 $cm^3$ cubic shaped piece of light transmissive body, under perpendicular irradiation of radiation having a selected luminescence wavelength (such as a wavelength corresponding to an emission maximum of the luminescence of the luminescent material of the light transmissive body), will have a transmission of at least 95%. Hence, the second bodies may herein also be indicated "light transmissive body", as this body is light transmissive for the luminescent material light. Herein, values for transmission especially refer to transmission without taking into account Fresnel losses at interfaces (with e.g. air). Hence, the term "transmission" especially refers to the internal transmission. The internal transmission may e.g. be determined by measuring the transmission of two or more bodies having a different width over which the transmission is measured. Then, based on such measurements the contribution of Fresnel reflection losses and (consequently) the internal transmission can be determined. Hence, especially, the values for transmission indicated herein, disregard Fresnel losses.

In embodiments, an anti-reflection coating may be applied to the luminescent bodies and/or second bodies, such as to suppress Fresnel reflection losses (during the light incoupling process).

The transmission can be determined by providing light at a specific wavelength with a first intensity to the light transmissive body under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

Further the second bodies have a second thermal conductivity K2. When there are different types of second bodies, such as second bodies comprising different (non-luminescent) materials, the thermal conductivity may be a weight averaged thermal conductivity. When al second bodies have essentially the same shapes and dimensions, the thermal conductivity may be an area averaged thermal conductivity.

Especially, in embodiments the second bodies may have a good thermal conductivity, and at least comparable to the thermal conductivity of the first bodies. Hence, in embodiments $K2 \geq 0.2*K1$. Even more especially, $K2 \geq 0.5*K1$. For better thermal management, the second bodies have a thermal conductivity at least as high as the thermal conductivity of the first bodies. Hence, in embodiments $K2 \geq K1$. Even more especially, $K2 > K1$, such as $K2 \geq 1.2*K1$, $K2 \geq 1.5*K1$, $K2 \geq 2*K1$, $K2 \geq 5*K1$ or $K2 \geq 10*K1$.

As indicated above, the bodies are especially configured in a 2D arrangement. This arrangement may be a regular arrangement or an irregular arrangement. In specific embodiments, the arrangement may be random or quasi random. Especially, the arrangement may be a regular arrangement.

In embodiments wherein the plurality of bodies comprises first bodies and second bodies, especially the plurality of first bodies and the plurality of second bodies are configured in a 2D arrangement. In embodiments, both may be arranged one (or more) of random or quasi random. Especially, however both arrangements together from a regular arrangement.

In specific embodiments, for a plurality of second bodies applies that they are configured adjacent to different first bodies. Hence, in embodiments the second bodies may be distributed over the arrangements of first and second bodies. Especially, the second bodies may be configured such that the second bodies are adjacent to as much as possible different first bodies. In other words, in embodiments clustering of second bodies may be minimized as much as possible. Would a regular arrangement of the bodies be used, there may be a pitch between the second bodies. Hence, the phrase "configured adjacent to different first bodies" may especially refer to the fact that one or more, especially a plurality of, first bodies are configured adjacent to a second body. The luminescent element may comprise a plurality of sets of second bodies configured adjacent to different first bodies. Hence, the term "different first bodies" may also be indicated as "various first bodies". In specific embodiments, the first bodies and second bodies may be configured in a checkerboard arrangement, though other (2D) arrangements may also be possible.

Especially, the bodies are configured in thermal contact with the thermally conductive support. Especially, the support is configured to support the bodies, such as the first bodies and second bodies. In embodiments, the support may comprise a body, such as a body of thermally conductive material.

As will be further elucidated below, the bodies may in embodiments be in physical contact with the thermally conductive support. Alternatively or additionally, in embodiments the bodies may be in physical contact with a coating on the thermally conductive support. Also in this way, the bodies may be configured in thermal contact with the thermally conductive support.

In embodiments, the thermally conductive support may be a heatsink. In other embodiments, the thermally conductive support may be in thermal contact with a heatsink. Hence, in specific embodiments, the thermally conductive support comprises a heat sink.

A thermally conductive material may especially have a thermal conductivity of at least about 20 W/m/K, like at least about 30 W/m/K, such as at least about 100 W/m/K, like especially at least about 200 W/m/K. In yet further specific embodiments, a thermally conductive material may especially have a thermal conductivity of at least about 10 W/m/K.

In embodiments, the thermally conductive material may comprise of one or more of copper, aluminum, silver, gold, silicon carbide, aluminum nitride, boron nitride, aluminum silicon carbide, beryllium oxide, a silicon carbide composite, aluminum silicon carbide, a copper tungsten alloy, a copper molybdenum carbide, carbon, diamond, and graphite. Alternatively, or additionally, the thermally conductive material may comprise or consist of aluminum oxide. Herein, especially, however, the thermally conductive element comprises metal material. For instance, the metal material may comprise one or more of copper, aluminum, silver, gold, and a metal alloy. The metal alloy may comprise one or more of copper tungsten alloys, aluminum alloys, titanium alloys, etc. The thermally conductive element may be a heat sink or may be in thermal contact with a heat sink.

Heatsinks are known in the art. The term "heatsink" (or heat sink) may especially be a passive heat exchanger that transfers the heat generated by device, such as an electronic device or a mechanical device, to a fluid (cooling) medium, often air or a liquid coolant. Thereby, the heat is (at least partially) dissipated away from the device. A heat sink is especially designed to maximize its surface area in contact with the fluid cooling medium surrounding it. Hence, especially a heatsink may comprise a plurality of fins. For instance, the heatsink may be a body with a plurality of fins extending thereof. A heatsink especially comprises (more especially consists of) a thermally conductive material. The term "heatsink" may also refer to a plurality of (different) heatsinks.

An element may be considered in thermal contact with another element if it can exchange energy through the process of heat. Hence, the elements may be thermally coupled. In embodiments, thermal contact can be achieved by physical contact. In embodiments, thermal contact may be achieved via a thermally conductive material, such as a thermally conductive glue (or thermally conductive adhesive). Thermal contact may also be achieved between two elements when the two elements are arranged relative to each other at a distance of equal to or less than about 10 µm, though larger distances, such as up to 100 µm may be possible. The shorter the distance, the better the thermal contact. Especially, the distance is 10 µm or less, such as 5 µm or less. The distance may be the distanced between two respective surfaces of the respective elements. The distance may be an average distance. For instance, the two elements may be in physical contact at one or more, such as a plurality of positions, but at one or more, especially a plurality of other positions, the elements are not in physical contact. For instance, this may be the case when one or both elements have a rough surface. Hence, in embodiments in average the distance between the two elements may be 10 µm or less (though larger average distances may be possible, such as up to 100 µm). In embodiments, the two surfaces of the two elements may be kept at a distance with one or more distance holders.

As indicated above, the plurality of first bodies and second bodies are especially configured in thermal contact with the thermally conductive support.

In view of optical efficiency, it may be desirable that the second bodies have a relatively low absorption for the light that can be used to generate the luminescent material light. Hence, especially second bodies may be chosen (especially their material) that in combination with the light source that is chosen to provide the radiation for the luminescent material, they are substantially, or even essentially, transmissive for that light. In this way, light source light ("radiation") that is not directed at the first bodies or that escapes from a first body, may be transmitted by a second body, and again enter another first body (or may be reflected by a second body, e.g. due to specular reflection, and enter again the same first body). In this way, the efficiency may be higher.

However, alternatively or especially additionally, it may be desirable that the second bodies have a relatively low absorption for the luminescent material light. Hence, especially second bodies may be chosen (especially their material) that in combination with the luminescent material (and light source) that is chosen to provide the radiation for the luminescent material, they are substantially, or even essentially, transmissive for that luminescent material light. In this way, luminescent material light that that escapes from a first body, may be transmitted by a second body, and not be absorbed by such second body. In this way, the efficiency may be higher.

Hence, in embodiments the second bodies may not comprise any luminescent material (that is excitable by the radiation (of the chosen light source)). Alternatively, in embodiments the second bodies may optionally comprise a luminescent material (that is excitable by the radiation (of the chosen light source)), but in such an amount, that essentially no radiation is absorbed. Further, the bodies may also not comprise a non-luminescent absorbing material for the radiation and/or luminescent light, or, would it comprise such non-luminescent absorbing material in such an amount, that essentially no radiation is absorbed.

Therefore, in specific embodiment the first bodies may have a first attenuation coefficient $\mu 1$ at one or more wavelengths of the first radiation, wherein the second bodies have a second attenuation coefficient $\mu 2$ at one or more wavelengths of the first radiation. In specific embodiments, $\mu 2 \leq 0.5*\mu 1$, such as $\mu 2 \leq 0.1*\mu 1$. For instance, in embodiments $\mu 2 \leq 0.01*\mu 1$. In embodiments, $\mu 2 \geq 0.00001*\mu 1$. Further, the first bodies have a third attenuation coefficient $\mu 3$ at one or more wavelengths of the luminescent material light, wherein the second bodies have a fourth attenuation coefficient $\mu 4$ at one or more wavelengths of the luminescent material light. In specific embodiments, $0.0051*\mu 3 \leq \mu 4 \leq 5*\mu 3$, such as $0.01*\mu 3 \leq \mu 4 \leq 2*\mu 3$. For instance, in embodiments $0.1*\mu 3 \leq \mu 4 \leq 2*\mu 3$, $0.2*\mu 3 \leq \mu 4 \leq 2*\mu 3$ or $0.5*\mu 3 \leq \mu 4 \leq 2*\mu 3$. The "linear attenuation coefficient", or "attenuation coefficient", or "narrow-beam attenuation coefficient" may indicate how easily a volume of material can be penetrated by a beam of light. A large attenuation coefficient means that the beam is quickly "attenuated" (weakened) as it passes through the medium, and a small attenuation coefficient means that the medium is relatively transparent to the beam.

Especially suitable material, especially in view of transparency, may be one or more of a garnet type of material, $Al_2O_3$, $TiO_2$, $CaF_2$, $MgO$, $BaF_2$, aluminum oxynitride, $MgAl_2O_4$ and $MgF_2$. Hence, in embodiments the second bodies comprise one or more of a garnet type of material, $Al_2O_3$, $TiO_2$, $CaF_2$, $MgO$, $BaF_2$, aluminum oxynitride, $MgAl_2O_4$ and $MgF_2$. As indicated above, especially the second bodies may also be single crystals or ceramic bodies.

In specific embodiments, the first element bodies may comprise $A_3B_5O_{12}$:Ce, (or indicated with the alternative formula $A_3B'_2C''_3O_{12}$:Ce (see also above), especially as ceramic body, and the second element bodies may comprise $A_3B_5O_{12}$ (or indicated with the alternative formula $A_3B'_2C''_3O_{12}$ (see also above), also especially as ceramic body.

An element body may have a single side face when the element body has a circular cross-section (or oval cross-section); an element body may have three side faces when the element body has a triangular cross-section; an element body may have four side faces when the element body has a rectangular (non-square) or square cross-section, etc.

Further, especially the second bodies may have one or more faces that are polished. Likewise, the first bodies may have one or more faces that are polished. Hence, reflection or scattering losses may thereby be minimized. Especially, this may apply to side faces. Hence, in embodiments one or more faces, especially one or more side faces, of the bodies may be polished. This may lead to a relatively low surface roughness, such as can be indicated with RMS and/or Ra. Optionally, also the bottom faces may be polished and may have a relatively low surface roughness.

In embodiments, the RMS roughness may be equal to or smaller than 50 nm, such as equal to or smaller than 20 nm, even more especially equal to or smaller than 10 nm, and in embodiments at least about 5 nm. Especially, the RMS roughness may be equal to or smaller than about 5 nm. Alternatively or additionally, the surface roughness, Ra may be at maximum 100 nm, such as in the range of 5-100 nm, like up to 50 nm.

In embodiments, the roughness of the top surfaces, especially of bodies comprising a luminescent material, may be larger than of the respective side face(s), such as e.g. a 10%, like at least 20%, or more higher RMS and/or a 10%, like at least 20%, or more higher Ra. A higher surface roughness (of the top face) may facilitate incoupling and/or outcoupling of light. Hence, in embodiments each of the plurality of element bodies may have one or more side faces, wherein the one or more side faces (of one or more element bodies, especially of a plurality of element bodies, even more especially of essentially all element bodies) are polished. In specific embodiments only the side faces of luminescent bodies (facing other side face of an adjacent luminescent body) may be polished. The top face and bottom face may have a larger surface roughness (than the one or more side faces). The bottom face may have a higher roughness, e.g. to improve adhesion (via an intermediate layer) to the thermally conductive support, such as a heatsink.

As indicated above, the arrangement of the bodies may be a regular arrangement. Hence, the plurality of element bodies may be configured in a regular array. More especially, in embodiments the first bodies and the second bodies may be configured in a regular array. Especially, the second bodies alternate with sets of first bodies, wherein the sets of first bodies may comprise one or more, such as 1-4, first bodies.

As indicated above, in embodiments the plurality of element bodies have identical cross-sectional dimensions. In alternative embodiments, the first bodies may have identical cross-sectional dimensions, and the second bodies may have identical cross-sectional dimensions different from the first bodies. Especially, in embodiments the first bodies and the second bodies may have identical cross-sectional dimensions. However, other embodiments may also be possible.

In specific embodiments, adjacent bodies may not be in physical contact with each other. This may reduce light losses. However, especially the distances are not too large, in order to allow thermal contact. In specific embodiments, two or more adjacent element bodies of the plurality of element bodies have a shortest distance (d1) selected from the range of 1-100 µm. Even more especially, all element bodies of the plurality of element bodies have a shortest distance (d1) selected from the range of 1-100 µm. This may reduce optical contact, but nevertheless there may be thermal contact. More especially, the shortest distance (d1) selected from the range of 1-50 µm, such as 2-20 µm, like up to 10 µm, such as selected from the range of 1-10 µm.

For better thermal contact with the thermally conductive support, in embodiments the faces of the element bodies directed to thermally conductive support may be larger than those directed away from the thermally conductive support. Hence, in embodiments each, of the plurality of element bodies have one or more side faces, wherein the side faces (of one or more element bodies, especially of a plurality of element bodies, even more especially of essentially all element bodies) taper in a direction away from the thermally conductive support.

The element bodies are supported by the thermally conductive support. To this end, the thermally conductive support may comprise cavities, in which the element may be arranged. The fit between the cavity and the body may be a clearance fit, with minimal clearance. Alternatively or additionally, the element bodies may be soldered to the thermally conductive support. To this end, the element bodies may be provided with a coating layer for facilitating soldering and/or providing reflection. Such coating layer may e.g. comprise one or more of Ag and Al. An advantage of such layer is also that such layer is reflective for light. Alternatively or additionally, a chromium comprising layer, such as Cr metal layer, may be provided. Especially, such may facilitate soldering. Optionally, such coating layer may be a multi-layer, with on the reflective layer a further layer that may especially facilitate soldering. Such layer may e.g. comprise chromium. Hence, in embodiments one or more, especially a plurality, of element bodies are attached to the thermally conductive support via a coating layer, such as a multi-layer. In specific embodiments, the multi-layer comprise a first layer comprising one or more of Al and Ag, a second layer comprising Cr, and a third layer being a solder layer. Such stack may be sandwiched by the element body, such as especially the first element bodies, and the thermally conductive support.

Hence, in embodiments the one more side faces may be at least partly in thermal contact, or even physical contact, with the thermally conductive support. Alternatively or additionally, a layer may be provided on the thermally conductive support that is in contact with the one or more side faces. Especially, for essentially all side faces may apply that at least part thereof is not in physical contact with a coating and/or another element body. Therefore, in embodiments each of the plurality of element bodies have one or more side faces, wherein for one or more side faces, especially a plurality, like essentially all, applies that part thereof is in contact with the thermally conductive support, or to a coating layer thereon, or to a reflective material.

As indicated above, in embodiments the coating layer may have reflective properties for one or more light source light and the luminescent material light. Yet further, in embodiments the thermally conductive support may have reflective properties for one or more light source light and the luminescent material light.

Many of the above-mentioned material in relation to thermally conductive material, especially the metals, may be not transmissive for visible light and/or UV radiation. Some of the above-mentioned thermally conductive materials, like alumina and garnet, may be transmissive for visible light and/or UV radiation. However, also materials that are not transmissive for visible light and/or UV radiation may be transmissive when e.g. a pinhole is provided, through which light may propagate to the element bodies. Hence, in specific embodiments the thermally conductive support is light transmissive for one or more wavelengths of the first radiation and the luminescent material light. Therefore, the luminescent element may in embodiments be operated in a reflective mode and/or in a transmissive mode. In the latter transmissive, pinholes and/or light transmissive thermally conductive material may be applied (for the thermally conductive support).

In embodiments, the element bodies may essentially have the same heights. Hence, when the element bodies have side faces perpendicular to end faces, the bottom face, directed to the thermally conductive support, and the top faces, directed away from the thermally conductive support may have essentially the same sizes. In such embodiments, when different element bodies are applied, the ratios of the surface areas of the respective element bodies may be used as factor to indicate the relative abundance of the respective element bodies. Hence, in embodiments the plurality of element bodies have first faces ("top face) and second faces ("bottom face") defining a body height (H), wherein the second faces are directed to the thermally conductive support, wherein differences in body height (H) are within 5% from an average height. In embodiments, the first faces defined a total first face area At, wherein the first bodies define k % of the total first face area At and wherein the second bodies defined 100-k % of the total first face area At. Especially, in embodiments $20 \leq k \leq 80$, such as $40 \leq k \leq 70$, like at least 50, such as at least about 60%. Hence, in embodiments there may be more first bodies than second bodies.

As indicated above, the light generating device comprises a light source. Especially, the light source is configured to generate the first radiation, and wherein the element bodies, especially the first bodies, are configured in a light receiving relationship with the light source. Therefore, in embodiments one or more of the element bodies are radiationally coupled to the light sources. Especially, the luminescent material (or the element bodies comprising the luminescent material) is (are) configured downstream of the light source.

The terms "radiationally coupled" or "optically coupled" may especially mean that (i) a light generating element, such as a light source, and (ii) another item or material, are associated with each other so that at least part of the radiation emitted by the light generating element is received by the item or material. In other words, the item or material is configured in a light-receiving relationship with the light generating element. At least part of the radiation of the light generating element will be received by the item or material. This may in embodiments be directly, such as the item or material in physical contact with the (light emitting surface of the) light generating element. This may in embodiments be via a medium, like air, a gas, or a liquid or solid light guiding material. In embodiments, also one or more optics, like a lens, a reflector, an optical filter, may be configured in the optical path between light generating element and item or material.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering). The term "laser light source" especially refers to a laser. Such laser may especially be configured to generate laser light source light having one or more wavelengths in the UV, visible, or infrared, especially having a wavelength selected from the spectral wavelength range of 200-2000 nm, such as 300-1500 nm. The term "laser" especially refers to a device that emits light through a process of optical amplification based on the stimulated emission of electromagnetic radiation. Especially, in embodiments the term "laser" may refer to a solid-state laser.

Hence, in embodiments the light source comprises a laser light source. In embodiments, the terms "laser" or "solid state laser" may refer to one or more of cerium doped lithium strontium (or calcium) aluminum fluoride (Ce:LiSAF, Ce:LiCAF), chromium doped chrysoberyl (alexandrite) laser, chromium ZnSe (Cr:ZnSe) laser, divalent samarium doped calcium fluoride (Sm:CaF$_2$) laser, Er:YAG laser, erbium doped and erbium—ytterbium codoped glass lasers, F-Center laser, holmium YAG (Ho:YAG) laser, Nd:YAG laser, NdCrYAG laser, neodymium doped yttrium calcium oxoborate Nd:YCa$_4$O(BO$_3$)$_3$ or Nd:YCOB, neodymium doped yttrium orthovanadate (Nd:YVO$_4$) laser, neodymium glass (Nd:glass) laser, neodymium YLF (Nd:YLF) solid-state laser, promethium 147 doped phosphate glass (147 Pm$^{3+}$:glass) solid-state laser, ruby laser (Al$_2$O$_3$:Cr$^{3+}$), thulium YAG (Tm:YAG) laser, titanium sapphire (Ti:sapphire; Al$_2$O$_3$:Ti$^{3+}$) laser, trivalent uranium doped calcium fluoride (U:CaF$_2$) solid-state laser, Ytterbium doped glass laser (rod, plate/chip, and fiber), Ytterbium YAG (Yb:YAG) laser, Yb$_2$O$_3$ (glass or ceramics) laser, etc. In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

A laser may be combined with an upconverter in order to arrive at shorter (laser) wavelengths. For instance, with some (trivalent) rare earth ions upconversion may be obtained or with non-linear crystals upconversion can be obtained. Alternatively, a laser can be combined with a downconverter, such as a dye laser, to arrive at longer (laser) wavelengths.

As can be derived from the below, the term "laser light source" may also refer to a plurality of (different or identical) laser light sources. In specific embodiments, the term "laser light source" may refer to a plurality N of (identical)

laser light sources. In embodiments, N=2, or more. In specific embodiments, N may be at least 5, such as especially at least 8. In this way, a higher brightness may be obtained. In embodiments, laser light sources may be arranged in a laser bank (see also above). The laser bank may in embodiments comprise heat sinking and/or optics e.g. a lens to collimate the laser light.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources. In specific embodiments, the light source light is thus especially collimated light source light. In yet further embodiments, the light source light is especially (collimated) laser light source light. The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape,) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

The beams (of light source light) may be focused or collimated beams of (laser) light source light. The term "focused" may especially refer to converging to a small spot. This small spot may be at the discrete converter region, or (slightly) upstream thereof or (slightly) downstream thereof. Especially, focusing and/or collimation may be such that the cross-sectional shape (perpendicular to the optical axis) of the beam at the discrete converter region is essentially not larger than the cross-section shape (perpendicular to the optical axis) of the discrete converter region (where the light source light irradiates the discrete converter region). Focusing may be executed with one or more optics, like (focusing) lenses. Especially, two lenses may be applied to focus the laser light source light. Collimation may be executed with one or more (other) optics, like collimation elements, such as lenses and/or parabolic mirrors. In embodiments, the beam of (laser) light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Optics may be used to provide (high) collimation (see also above).

In embodiments, laser light sources may be arranged in a laser bank. The laser bank may in embodiments comprise heat sinking and/or optics e.g. a lens to collimate the laser light. A laser bank may e.g. comprise at least 10, such as at least 20 laser light sources.

The light source is configured to generate light source light. The light source is especially selected to provide light source light that can excite the luminescent material. For instance, in embodiments the light source light may be blue light, as blue light can excite a number of possible garnet type materials. However, other wavelengths than blue may also be possible. For instance, in embodiments the light source light may be ultraviolet or green. Different light sources configured to generate spectrally different light source light may also be possible.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

In specific embodiments, the luminescent element and the light source are configured in a reflective mode. Alternatively or additionally, in embodiments the luminescent element and the light source are configured in a transmissive mode.

Especially, in embodiments in an operational mode the light generating device is configured to generate white device light having a CRI of at least 80, such as at least 85. In specific embodiments, the device light may comprise the first radiation and the luminescent material light. Especially, in such embodiments the first radiation may comprise blue light. Hence, the first light source may comprise or be a laser light source.

In embodiments, the white device light has a color rendering index (CRI) of at least 80, such as at least 85, like at least 90. Further, in embodiments the white device light may have a correlated color temperature (CCT) selected from the range of 1800-8000 K, such as 2000-6500 K, like for instance selected from the range of 2700-3000 K.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

Especially, in embodiments the light source comprises a laser light source.

The lumen equivalent of the white device light (escaping from the luminescent body) may in embodiments be selected from the range of 290-370 lm/W, such as 300-360 lm/W. In embodiments, the light generating device is configured to provide the luminescent light with power emitted from a radiation exit face of the luminescent body having a power density of 4 W/mm$^2$, especially a power density at least 7 W/mm$^2$, more especially at least 9 W/mm$^2$, even more especially at least 13 W/mm$^2$. Hence, in embodiments in an operational mode of the light generating device, the light generating device is configured to generate the luminescent material light from a radiation exit surface (or radiation exit face) of the luminescent converter with a power density of at least 4 W/mm$^2$. In yet further specific embodiments, the lighting device may be configured to provide luminescent light in combination with blue and/or red laser light coming out the same surface as the luminescent light providing white light with a brightness of at least 2000 lm/mm$^2$, more especially at least 3000 lm/mm$^2$, even more especially at least 6000 lm/mm$^2$ Herein, "lm" refers to lumen.

In embodiments, the light generating device may further comprise a control system or may be functionally coupled to a control system. The control system may control the light sources. Especially when two or more light sources are available, a control system may be applied to control the two or more light sources (individually).

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. The device is thus not necessarily coupled to the lighting system, but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

The system, or apparatus, or device may execute an action in a "mode" or "operation mode" or "mode of operation". Likewise, in a method an action or stage, or step may be executed in a "mode" or "operation mode" or "mode of operation" or "operational mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme.

In yet a further aspect, the invention also provides a lamp or a luminaire comprising the light generating device as defined herein. The luminaire may further comprise a housing, optical elements, louvres, etc. etc . . . In yet a further aspect, the invention also provides a projection device comprising the light generating device as defined herein. Especially, a projection device or "projector" or "image projector" may be an optical device that projects an image (or moving images) onto a surface, such as e.g. a projection screen. The projection device may include one or more light generating devices such as described herein.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting.

As indicated above, the lighting unit may be used as backlighting unit in an LCD display device. Hence, the invention also provides an LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Preferably, the light source is a light source that during operation emits (light source light) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1A:
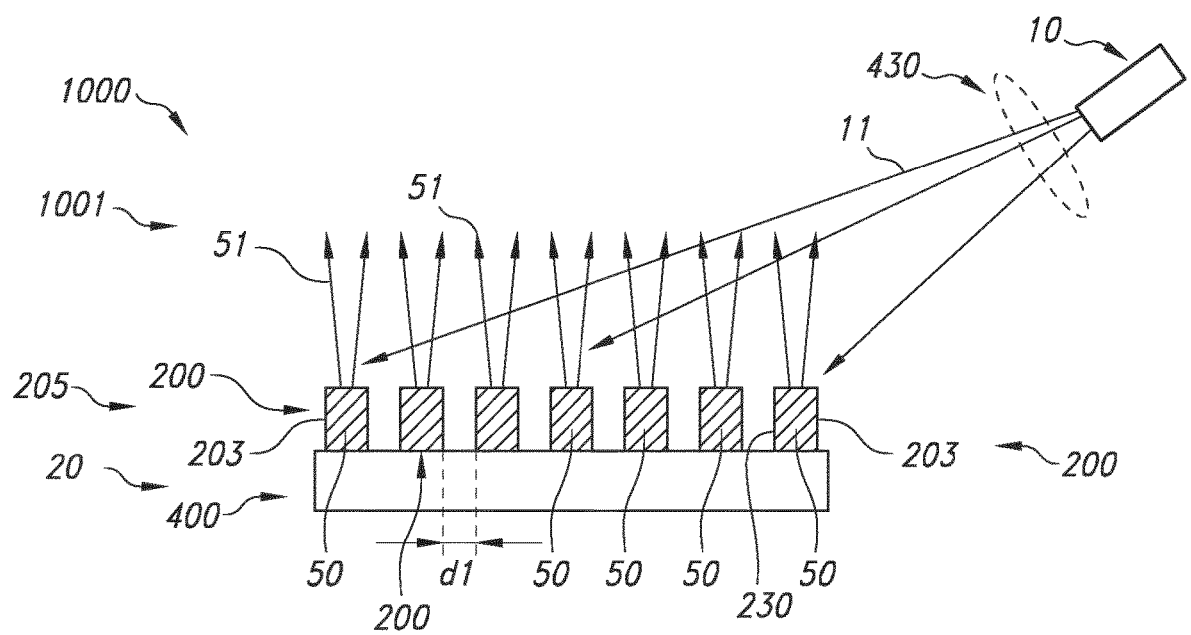
FIG. 1a-1f schematically depict some embodiments.

FIG. 1a schematically depicts an embodiment of a luminescent element 20, as well as an embodiment of a light generating device 1000 comprising a light source 10 and the luminescent element 20. The light source 10 is configured to generate the first radiation 11. Especially, the light source 10 may comprise a laser light source. Hence, the first radiation 11 may be laser light. In embodiments, the first radiation may be blue radiation. Reference 430 refers to an optional optical element, such as a lens, which may be used to beam shape the radiation 11, such as collimate the first (laser) radiation 11. The luminescent element 20 comprises a plurality of element bodies 200 and a thermally conductive support 400. The plurality of bodies 200 are configured in a 2D arrangement 205. Especially, the plurality of bodies 200 are configured in thermal contact with the thermally conductive support 400, such as in physical contact or in physical contact with a (multi)layer on the thermally conductive support 400. One or more of the bodies 200, herein also indicated as element bodies, comprise a luminescent material 50. The luminescent material 50 is configured to convert at least part of first radiation 11 into luminescent material light 51. The first radiation may be selected from one or more of UV radiation and visible radiation. In embodiments, the luminescent material light 51 may comprise one or more of green, yellow, orange, and red light. As will be described also below, in specific embodiments, different (first) bodies may comprise different luminescent materials. The bodies 200 are configured in a light receiving relationship with the light source 10.

Here, by way of example the light source 10 and luminescent element are configured in a reflective configuration. However, other configurations may also be possible.

The light generating device 1000 may generate device light 1001, which may at least comprise the luminescent material light 51 and optionally also first radiation 11. The device light 1001 may comprise also first radiation 11 that bypasses the luminescent element 20 (and is thus not reflected or transmitted by the element). To this end, a beam splitter and/or a second light source may be applied.

In embodiments, the plurality of element bodies 200 are configured in a regular (2D) array. When the element bodies 200, such as in embodiments the first bodies 210 and the second bodies 220, are configured in an array, the element bodies may especially comprise at least three side faces 203, such as in embodiments 3, 4 or 6.

In embodiments, two or more adjacent element bodies 200 of the plurality of element bodies 200 have a shortest distance d1 selected from the range of 1-100 µm, such as 1-10 µm, like smaller than 10 µm.

The element bodies 200 may have one or more side faces 203, a top face or first face 201 and a bottom face or second face 202. The latter is directed to the thermally conductive element 400; the former may also have the function as radiation exit window. In embodiments, the one or more side faces 203 are polished.

Figure 1B:
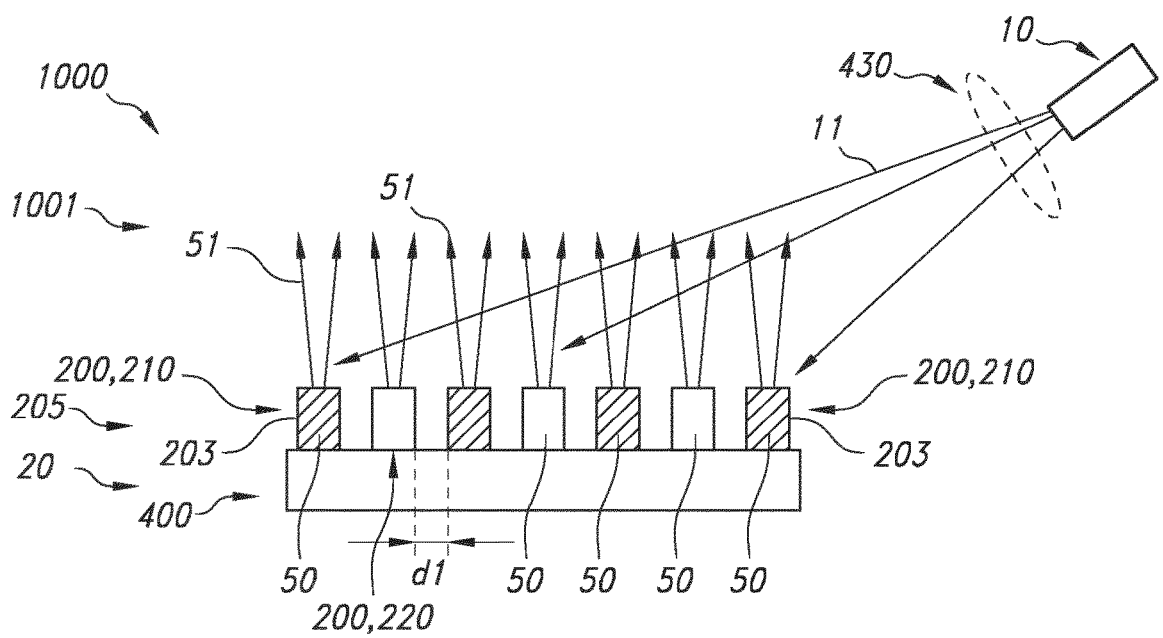

FIG. 1b schematically depicts a similar embodiment as schematically depicted in FIG. 1a. Here, the plurality of element bodies 200 comprises a plurality of first bodies 210 and a plurality of second bodies 220.

Especially, the plurality of first bodies 210 comprise a luminescent material 50. As indicated above, the luminescent material 50 is configured to convert at least part of first radiation 11, selected from one or more of UV radiation and visible radiation, into luminescent material light 51. The first bodies have a first thermal conductivity K1. As indicated above, (at least) the first bodies 210 are configured in a light receiving relationship with the light source 10.

The second bodies 220 are different from the first bodies 210. Especially, the plurality of second bodies 220 are light transmissive for one or more wavelengths of the first radiation 11 and the luminescent material light 51. Further, the second bodies 220 have a second thermal conductivity K2. Especially, in embodiments $K2 \geq 0.2*K1$, even more especially $K2 \geq 0.5*K1$, such as $K2 > *K1$, $K2 \geq 1.5*K1$, $K2 \geq 2*K1$, $K2 \geq 5*K1$ or $K2 \geq 10*K1$.

The plurality of first bodies 210 and the plurality of second bodies 220 are configured in a 2D arrangement 205. As schematically depicted, for a plurality of second bodies 220 applies that they are configured adjacent to different first bodies 210. Further, the plurality of first bodies 210 and second bodies 220 are configured in thermal contact with the thermally conductive support 400.

Referring to FIGS. 1a-1b (and further figures), in embodiments, the luminescent material 50 may comprise a luminescent material of the type $A_3B_5O_{12}$:Ce, wherein A comprises one or more of Y, La, Gd, Tb and Lu, and wherein B comprises one or more of Al, Ga, In and Sc. The first bodies 210 may comprise one or more of single crystals and ceramic bodies. Hence, the first bodies 210 may in embodiments comprise the luminescent material of the type $A_3B_5O_{12}$:$Ce^{3+}$. In embodiments, the second bodies 220 may comprise one or more of a garnet type of material, $Al_2O_3$, $TiO_2$, $CaF_2$, MgO, $BaF_2$, aluminum oxynitride, $MgAl_2O_4$ and $MgF_2$. Further, in embodiments (also) the second bodies 220 may comprise one or more of single crystals and ceramic bodies.

In embodiments, the first bodies 210 may have a first attenuation coefficient µ1 at one or more wavelengths of the first radiation 11, and the second bodies 220 may have a second attenuation coefficient µ2 at one or more wavelengths of the first radiation 11. Especially, $\mu2 \leq 0.1*\mu1$. Further, in embodiments the first bodies 210 may have a third attenuation coefficient µ3 at one or more wavelengths of the luminescent material light 51, and the second bodies 210 may have a fourth attenuation coefficient µ4 at one or more wavelengths of the luminescent material light 51. Especially, in embodiments $0.01*\mu3 \leq \mu4 \leq 2*\mu3$.

Figure 1C:
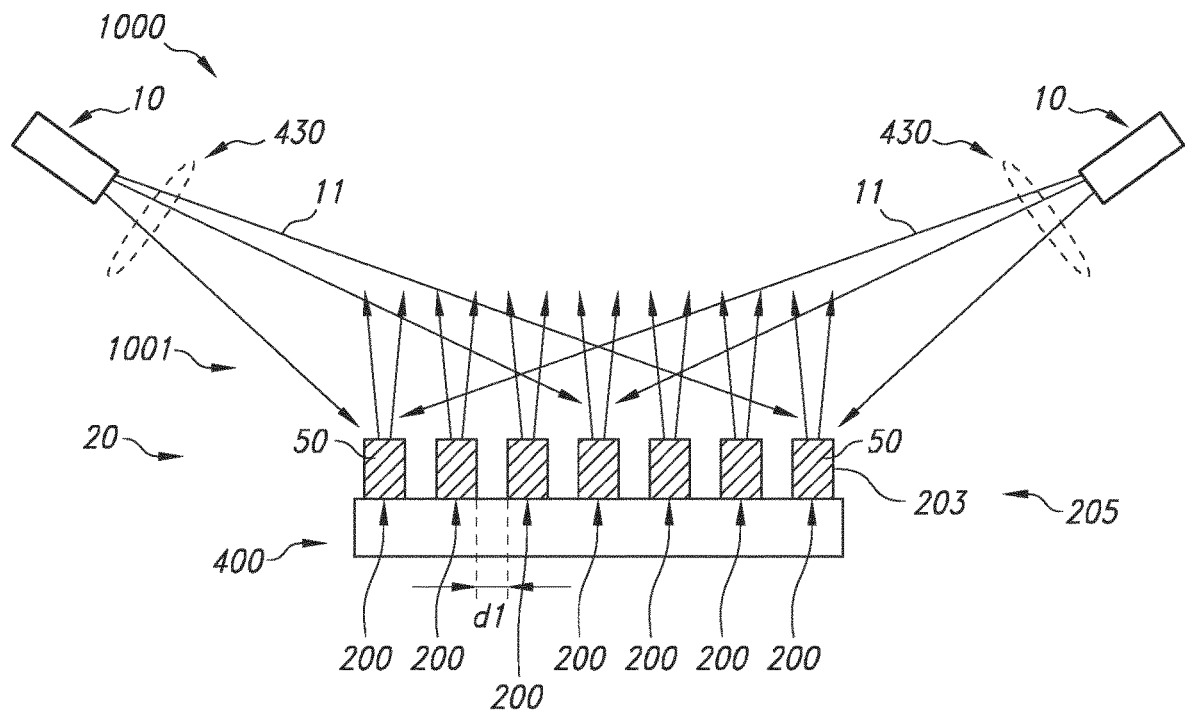

In FIG. 1c, by way of example a plurality of light sources 10 is applied. These light sources 10 may in embodiments be of the same bin, though other embodiments may also be possible.

Figure 1D:
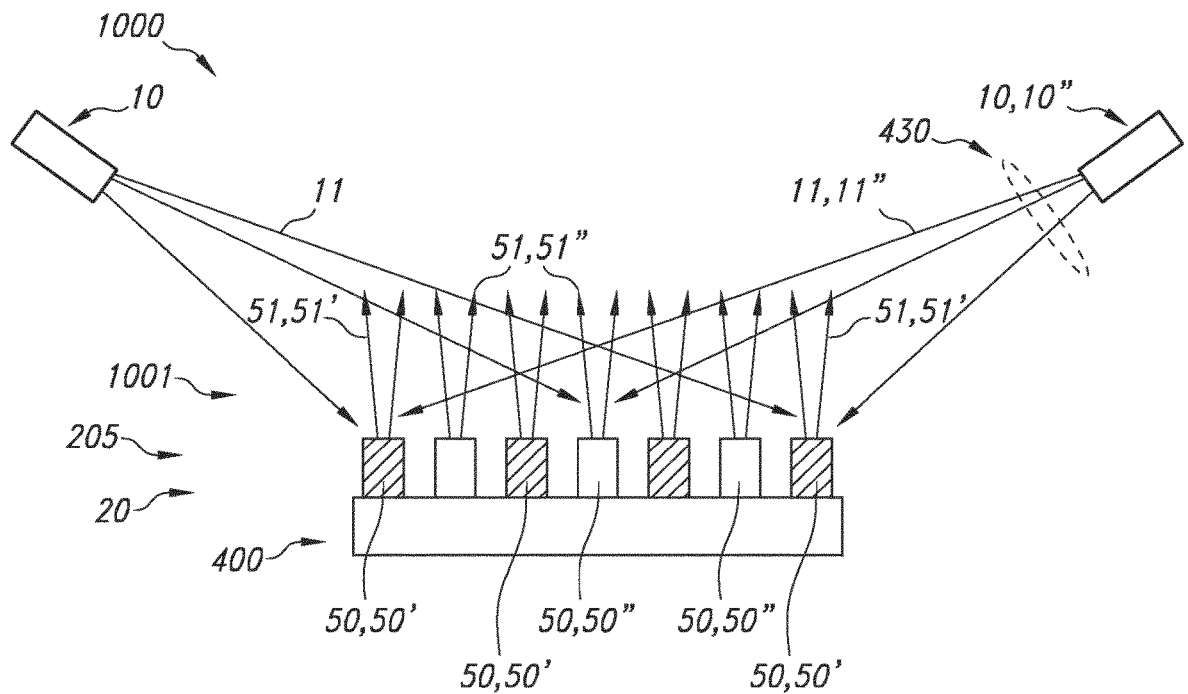

Referring to FIG. 1d, schematically an embodiment is depicted wherein the light generating device 1000 comprises a plurality of bodies 200, wherein a plurality of first bodies 210 comprises a first subset of first bodies 210 and a second subset of first bodies 210, wherein the first subset of first bodies comprise a first luminescent material and wherein the second subset of first bodies 210 comprises a second luminescent material, different from the first luminescent material. First luminescent material 50 of the first subset is indicated with reference 50', and the first luminescent material 50 of the second subset is indicated with reference 50". Likewise, the first luminescent material light 51 of the first subset is indicated with reference 51', and the first luminescent material light 51 of the second subset is indicated with reference 51".

The light generating device 1000 may generate device light 1001, which may at least comprise the luminescent material light 51', the luminescent material light 51" and optionally also first radiation 11. Here, by way of example two light sources 10 are depicted. There may be more than two light sources 10. When there are different luminescent materials 50, it may in embodiments be useful to use different light sources 10, as they may be optimized to pump the respective luminescent material 50.

Figure 1E:
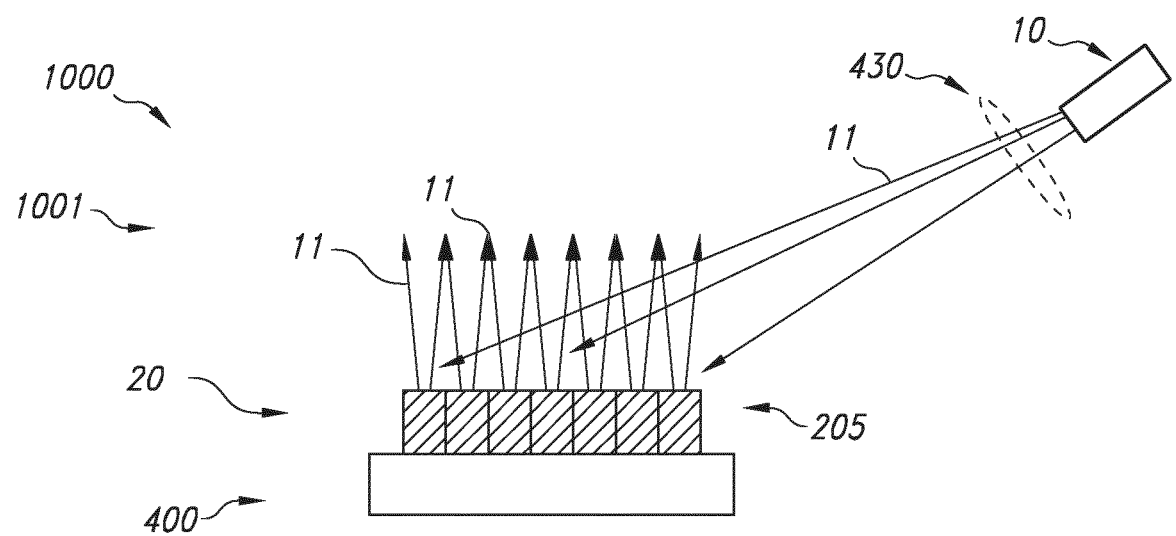

FIG. 1e schematically depicts in more detail that part of the radiation 11 may be reflected, and may—together with the luminescent material light—form the device light 1001.

Figure 1F:
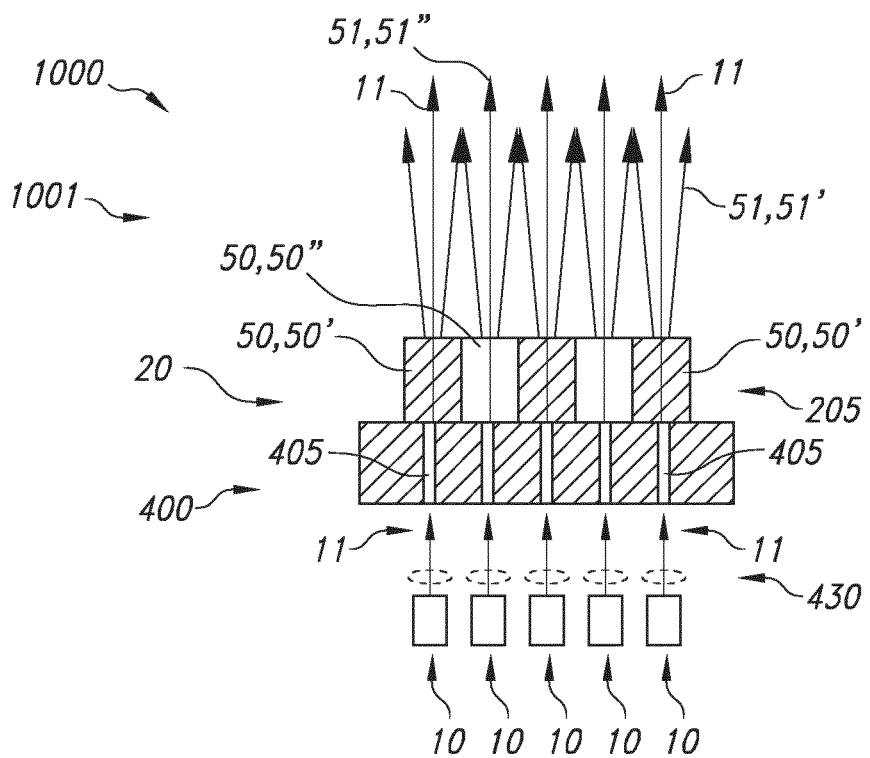

In specific embodiments, as schematically depicted in FIG. 1f, the thermally conductive support 400 may comprise one or more pinholes 405. Hence, the luminescent element 20 and the light source 10 may also be configured in a transmissive mode. Optionally, part of the radiation 11 may be transmitted by the element bodies 200. Hence, also in this embodiment it is possible that the radiation 11 is comprised by the device light 1001. When the radiation 11 is comprised by the device light 1001, the radiation 11 will in embodiments be essentially visible radiation. Alternatively or additionally, the thermally conductive support 400 may be of a material that is transmissive for the radiation 11. Hence, in specific embodiments the thermally conductive support 400 is light transmissive for one or more wavelengths of the first radiation 11 and the luminescent material light 51.

Hence, in an operational mode the light generating device 1000 is configured to generate white device light 1001 having a CRI of at least 85, wherein the device light 100 comprises the first radiation 11 and the luminescent material light 51, wherein in specific embodiments the first radiation 11 comprises blue light.

Figure 2:
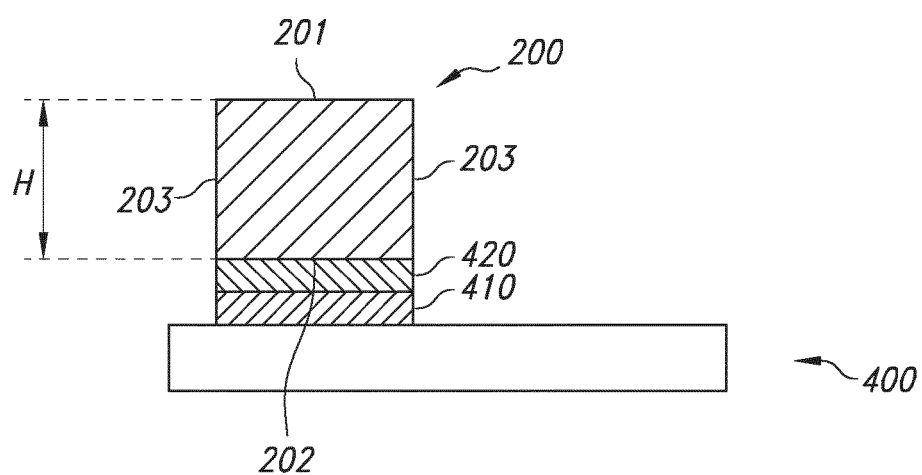
FIG. 2 schematically depict a further embodiment.

As schematically depicted in FIG. 2, the element bodies may be the thermally conductive support 400, or to a coating layer 410 thereon, or to a reflective material 420, and wherein the thermally conductive support 400 comprises a heat sink. The coating layer 410 may be a solder layer or an adhesive layer for a solder layer (a separate solder layer is not depicted in the schematically drawn embodiment of FIG. 2). The reflective material 420 may e.g. be Al or Ag. Hence, in embodiments the plurality of element bodies 200 may be attached to the thermally conductive support 400 via a coating layer 410. The coating layer may e.g. be a solder layer.

Figure 3A:
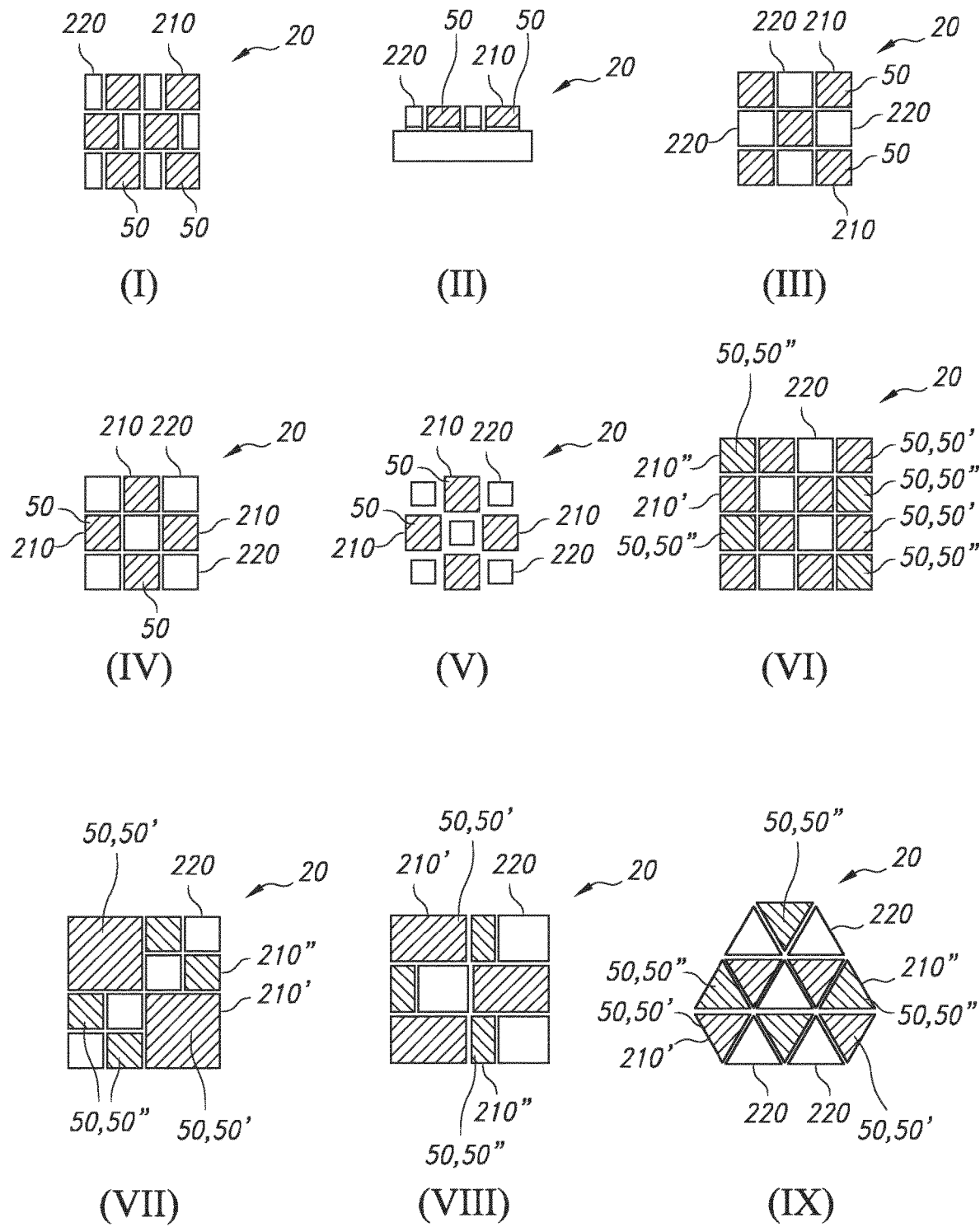
FIGS. 3a-3g schematically depict some further embodiments and variants.

Amongst others, it is herein suggested to use multiple small tiles of ceramic phosphor (eventually emitting different colors) with a very small air gap between the tiles for avoiding stress cracking and/or delamination. The small tiles may be coated with a metal layer from the bottom such as aluminum or silver having high reflectivity and soldered to a heat sink. In order to further improve thermal properties, it is herein suggested placing non-luminescent, light transmitting heat conducting tiles between the luminescent tiles. Various embodiments thereof are also schematically depicted in FIG. 3a.

Embodiment I schematically depicts a top view of the element 20, with first bodies 210 and second bodies 220, having different dimensions. A sideview of an embodiment is schematically depicted in embodiment II. Embodiments III and IV schematically depicts of the element 20, with first bodies 210 and second bodies 220, having essentially the same dimensions. Embodiment V schematically depicts another embodiment in a top view of the element 20, with first bodies 210 and second bodies 220, having different dimensions. Embodiments VI-VIII schematically depict embodiments wherein the first bodies 210 comprise a first subset of first bodies 210, indicated with reference 210', with a first luminescent material, and a second subset of first bodies 210, indicated with reference 210", with a second luminescent material, wherein the different luminescent material have different luminescent material light. In embodiment V, all bodies 200 have essentially the same sizes. In embodiments VI-VII, the various bodies 200 have a number of different sizes and shapes. In embodiment VIII, yet another variant with different shapes is schematically depicted.

In this way heat management can be improved considerably by these side tiles. When luminescent tiles emitting different colors are used, as sideway emission from the phosphors will be transmitted through the ceramic which has a high heat conductivity and light transmission, emitted light will mix to a better extent to obtain uniform color mixing. Preferably the blocks have high transmission (preferably transparent), and this can be obtained using e.g. sapphire. In order to further reduce delamination/crack formation issues and/or improve color mixing, the luminescent and non-luminescent tiles may differ in number, dimension, shape, orientation, density, neighboring composition and/or gaps between the tiles (see also FIG. 3a).

Amongst others, it is herein (also) suggested to use multiple small tiles of ceramic phosphor with a very small air gap between the tiles for avoiding stress cracking and/or delamination. The small phosphor tiles may be coated with a metal layer from the bottom such as aluminum or silver having high reflectivity and soldered to a heat sink, see. e.g. FIG. 2, but also e.g. FIG. 3f. In order to further improve the brightness, stability and thermal management, the air gap may be less than 30 µm, especially less than 10 µm, such as less than 5 µm. For close packaging, the tiles' side surfaces may be preferably polished. For improved light extraction the top surface may be rough (not shown). In order to improve adhesion the bottom surface may be rough (not shown).

Figure 3B:
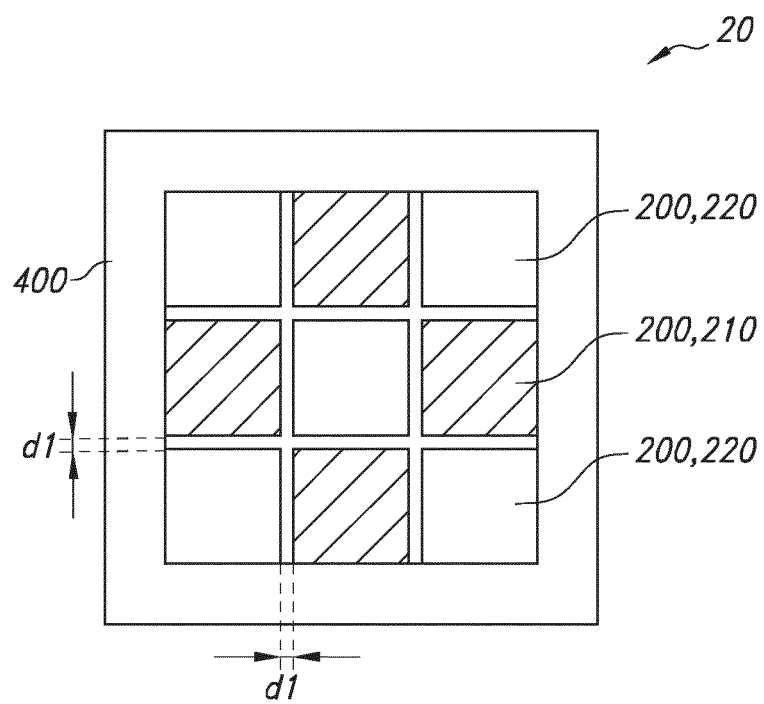

FIG. 3b schematically depicts an embodiment, wherein the distance d1 may e.g. be selected from the range of 1-100 µm.

Figure 3C:
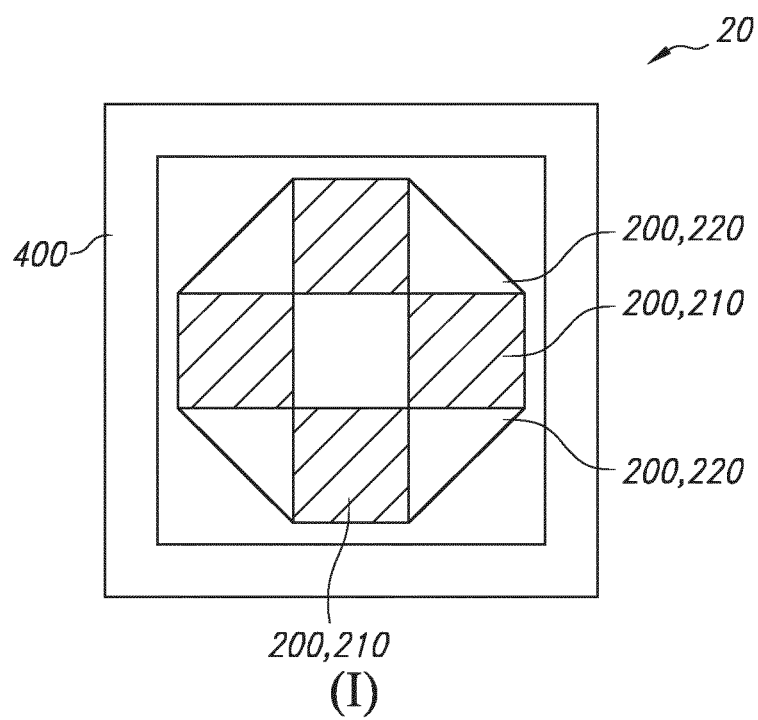
Figure 3C:
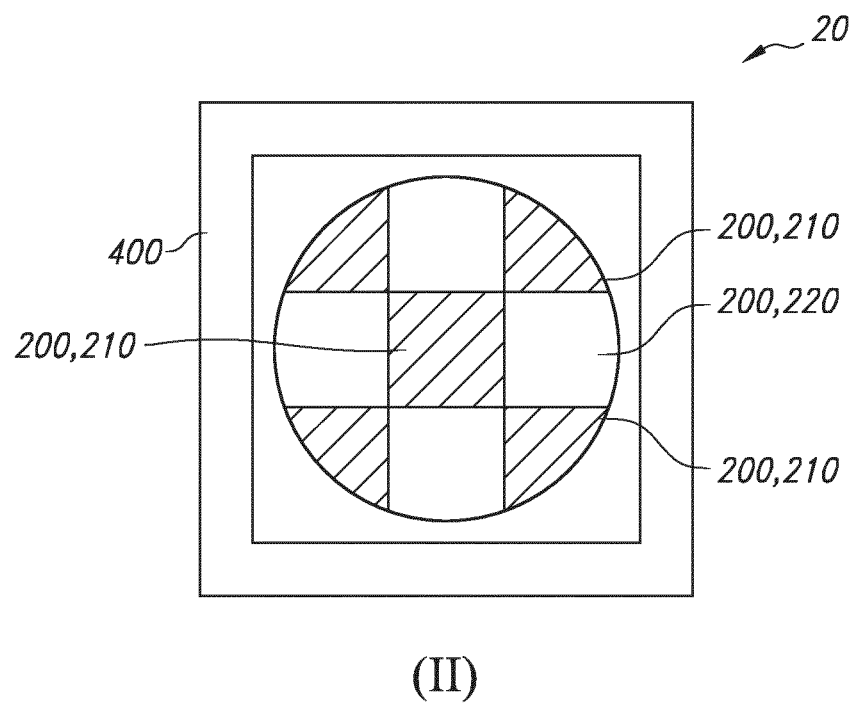

FIG. 3c schematically depicts different variants. Such shapes may e.g. be more desirable in view of the shape of the device light. The device light may have a cross-sectional shape which may be more conformal with a circle than with a square. The element 20 may comprise bodies of the first type and of the second type, but may in other embodiments only comprise bodies of the first type (i.e. comprising luminescent material).

For close packing it may be necessary that the tiles' side surfaces are perpendicular to the bottom plane and they have cross-sections such as rectangle, hexagon, triangle and combinations thereof. Eventually combination of different shapes and particular arrangement thereof can be used to obtain differently shaped phosphor assemblies such as a circle etc. (FIG. 3c).

Figure 3D:
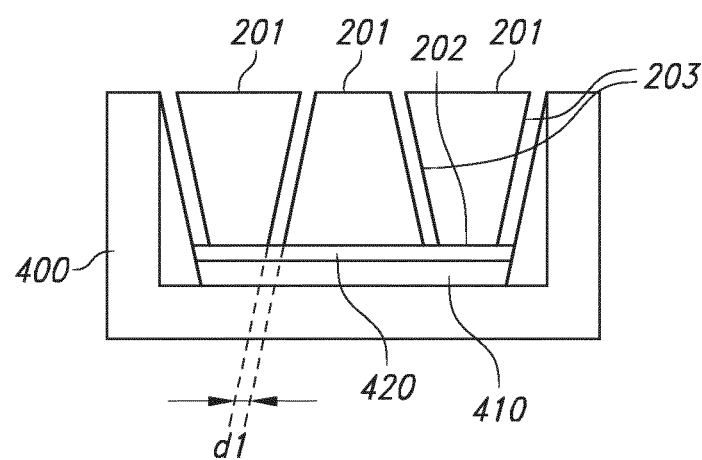

The tiles' side surfaces 203 may also be slightly tilted with respect to each other such that they are clamped in the configuration (FIG. 3d).

Amongst others, it is herein also suggested to use multiple small tiles of ceramic phosphor with a small air gap between the tiles for avoiding stress cracking and/or delamination. The small phosphor tiles may be coated with a metal layer from the bottom such as aluminum or silver having high reflectivity and soldered to a heat sink.

Figure 3E:
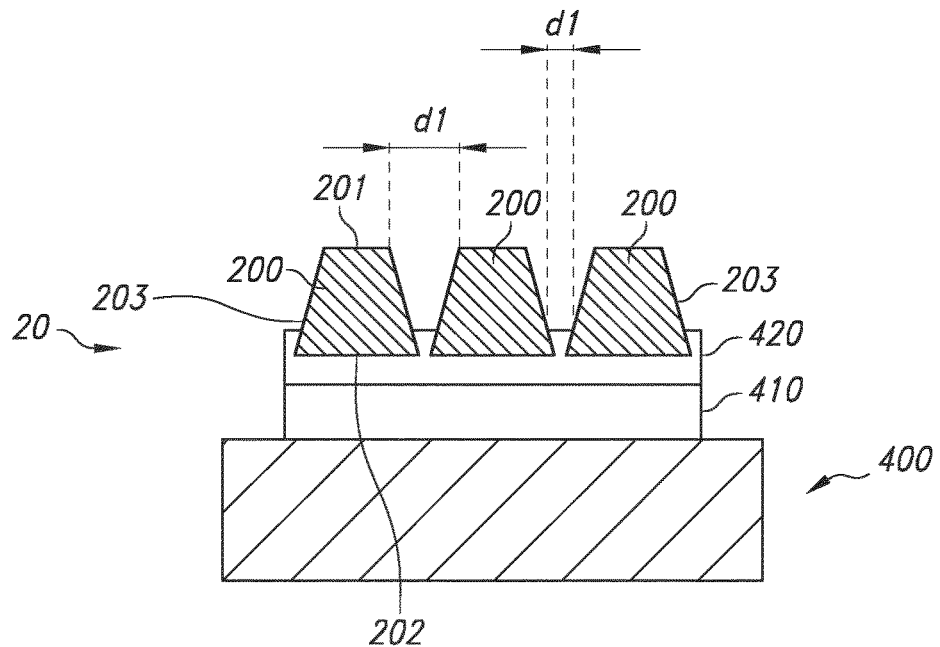

Tapering in a direction of the top face 201 may also improve thermal management and light reflection, and reduce stress cracking and/or delamination (FIG. 3e). Hence, in embodiments each of the plurality of element bodies 200 have one or more side faces 203, wherein the side faces 203 taper in a direction away from the thermally conductive support 400 400 (i.e. tapering from the bottom face 202 to the top face 201).

In order to further improve thermal while maintaining sufficiently high light outcoupling it is in (other) embodiments proposed to use tapered tiles which can have high close packing on the top surface (FIG. 3f) where they are separated at the bottom so that side surfaces may be partially coated. Hence, in embodiments each of the plurality of element bodies 200 have one or more side faces 203, wherein the side faces 203 taper in a direction from the thermally conductive support 400 (i.e. tapering from the top face 201 to the bottom face 202).

For close packing cross-sections such as rectangle, hexagon, triangle and combinations thereof are used. Tapering takes care of good light extraction. In embodiments, 10 to 50% of the side surface are coated. The height of the coverage may vary along the perimeter of the tiles (FIG. 3g).

Figure 3F:
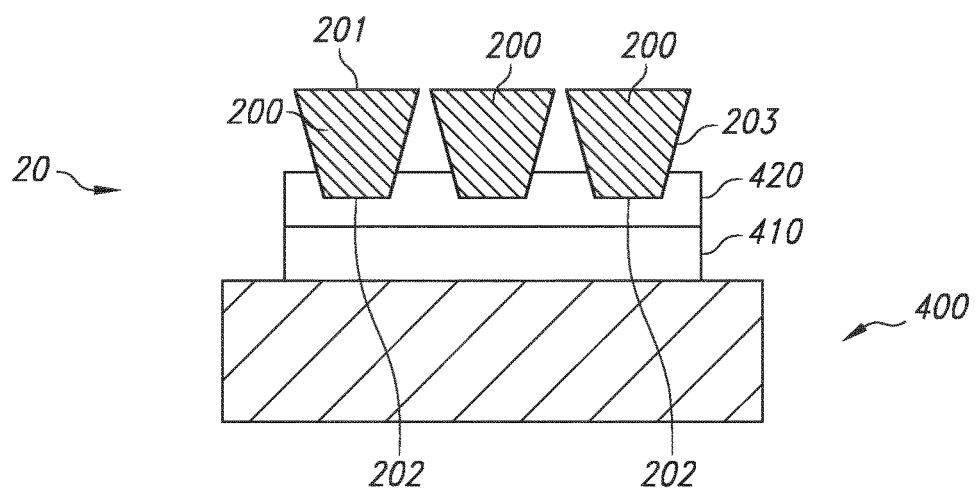
Figure 3G:
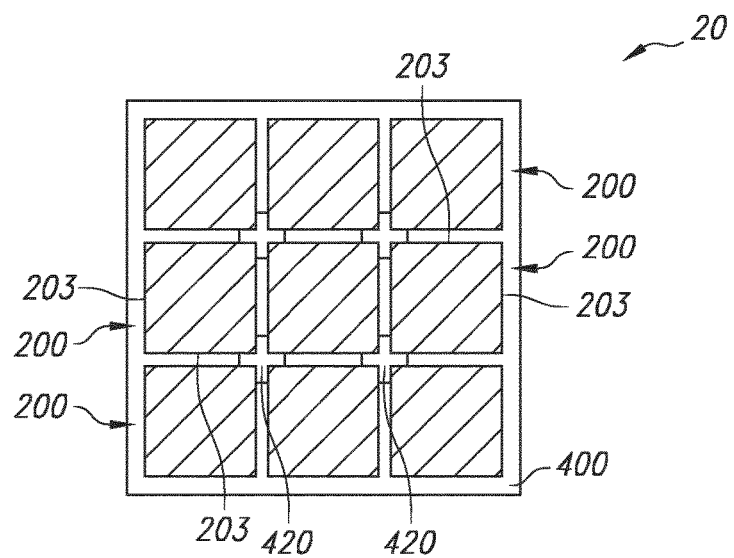

Referring to FIGS. 3e-3g, in embodiments one or more, especially each, of the plurality of element bodies 200 have one or more side faces 203, wherein for one or more side faces 203 applies that part thereof is in contact with the thermally conductive support 400, or to a coating layer 410 thereon, or to a reflective material 420, and wherein the thermally conductive support 400 comprises a heat sink.

In embodiments, the plurality of element bodies 200 have first faces 201 and second faces 202 defining a body height h, wherein the second faces 202 are directed to the thermally conductive support 400, wherein differences in body height h are within 5% from an average height, wherein the first faces 210 defined a total first face area At, wherein the first bodies 210 define k % of the total first face area At and wherein the second bodies 220 defined 100-k % of the total first face area At, wherein 20≤k≤80.

Figure 4:
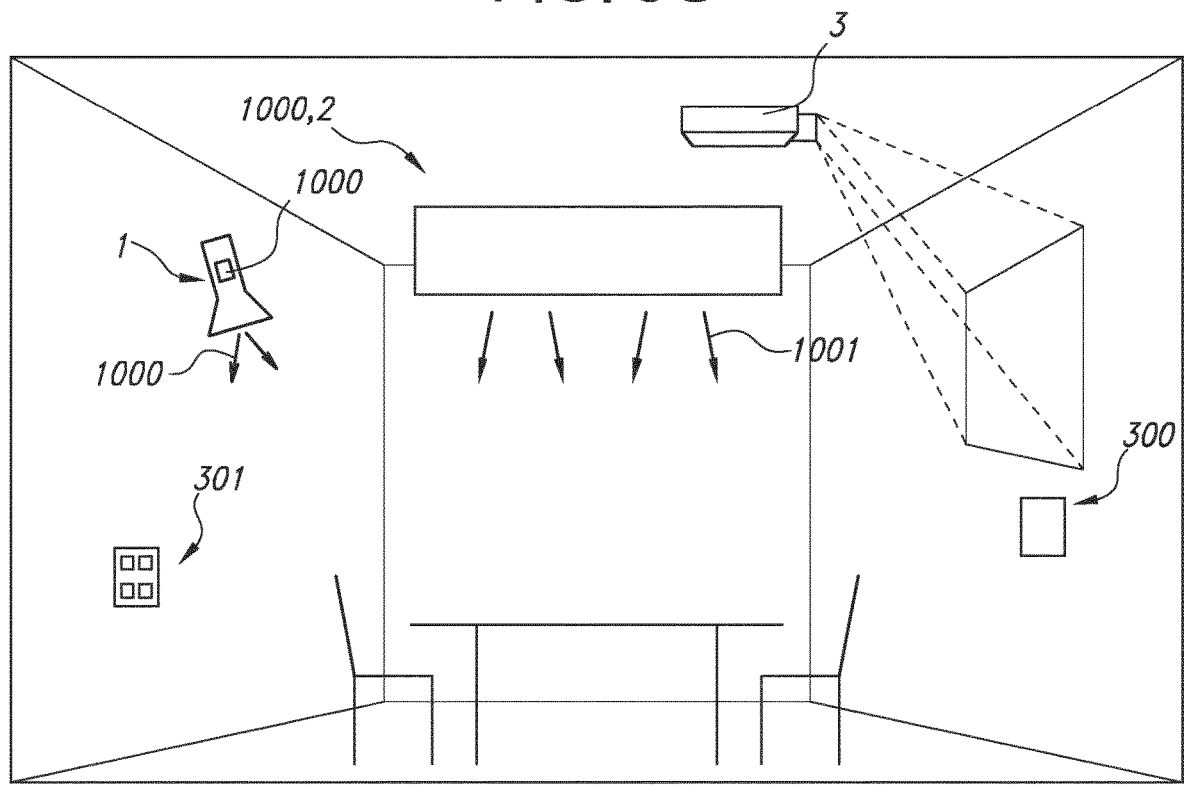
FIG. 4 schematically depicts embodiments of applications. The schematic drawings are not necessarily to scale.

FIG. 4 schematically depicts an embodiment of a luminaire 2 comprising the light generating device 1000 as described above. Reference 301 indicates a user interface which may be functionally coupled with the control system 300 comprised by or functionally coupled to the lighting system 1000. FIG. 4 also schematically depicts an embodiment of lamp 1 comprising the light generating device 1000. Reference 3 indicates a projector device or projector system, which may be used to project images, such as at a wall.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" also includes embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

Amongst others, the invention provides in embodiments a luminescent element and a light generating device comprising such luminescent element, wherein the luminescent element comprises an arrangement of ceramic bodies of luminescent material and ceramic bodies of non-luminescent material, configured in an array, at small distances of each other (e.g. 1-10 µm).

The invention claimed is:

1. A light generating device comprising a light source and a luminescent element, wherein:

the light source is configured to generate first radiation selected from one or more of UV radiation and visible radiation; wherein the light source comprises a laser light source;

the luminescent element comprises (i) a plurality of element bodies and (ii) a thermally conductive support; wherein the plurality of element bodies comprises a plurality of first bodies and a plurality of second bodies, the plurality of second bodies being different from the plurality of first bodies;

the plurality of first bodies comprise a luminescent material, wherein the luminescent material is configured to convert at least part of the first radiation into luminescent material light; wherein the first bodies have a first thermal conductivity K1; wherein the first bodies are configured in a light receiving relationship with the light source;

the plurality of second bodies are light transmissive for one or more wavelengths of the first radiation and the luminescent material light; wherein the second bodies have a second thermal conductivity K2, wherein $K2 \geq 0.2*K1$;

the plurality of first bodies and the plurality of second bodies are configured in a 2D arrangement, wherein for the plurality of second bodies applies that they are configured adjacent to different first bodies; and the plurality of first bodies and second bodies are configured in thermal contact with the thermally conductive support, wherein the first bodies have a first attenuation coefficient $\mu 1$ at one or more wavelengths of the first radiation, wherein the second bodies have a second attenuation coefficient $\mu 2$ at one or more wavelengths of the first radiation, wherein $\mu 2 \leq 0.1*\mu 1$, and wherein the first bodies have a third attenuation coefficient $\mu 3$ at one or more wavelengths of the luminescent material light, wherein the second bodies have a fourth attenuation coefficient $\mu 4$ at one or more wavelengths of the luminescent material light, wherein $0.01*\mu 3 \leq \mu 4 \leq 2*\mu 3$.

2. The light generating device according to claim 1, wherein the first bodies comprise one or more of single crystals and ceramic bodies, wherein the luminescent material comprises a luminescent material of the type $A_3B_5O_{12}$:Ce, wherein A comprises one or more of Y, La, Gd, Tb and Lu, and wherein B comprises one or more of Al, Ga, In and Sc.

3. The light generating device according to claim 1, wherein $\mu 2 \leq 0.01*\mu 1$ and wherein $0.5*\mu 3 \leq \mu 4 \leq 2*\mu 3$.

4. The light generating device according to claim 1, wherein the second bodies comprise one or more of a garnet type of material, $Al_2O_3$, $TiO_2$, $CaF_2$, MgO, $BaF_2$, aluminum oxynitride, $MgAl_2O_4$ and $MgF_2$.

5. The light generating device according to claim 1, wherein the plurality of first bodies comprises a first subset of first bodies and a second subset of first bodies, wherein the first subset of first bodies comprise a first luminescent material and wherein the second subset of first bodies comprises a second luminescent material, different from the first luminescent material.

6. The light generating device according to claim 1, wherein the plurality of element bodies are configured in a regular array.

7. The light generating device according to claim 1, wherein two or more adjacent element bodies of the plurality of element bodies have a shortest distance selected from the range of 1-100 µm.

8. The light generating device according to claim 1, wherein each of the plurality of element bodies have one or more side faces, wherein the one or more side faces are polished.

9. The light generating device according to claim 1, wherein each of the plurality of element bodies have one or more side faces, wherein the side faces taper in a direction away from the thermally conductive support.

10. The light generating device according to claim 1, wherein the plurality of element bodies are attached to the thermally conductive support via a coating layer.

11. The light generating device according to claim 1, wherein each of the plurality of element bodies have one or more side faces, wherein for one or more side faces applies that part thereof is in contact with the thermally conductive support, or to a coating layer thereon, or to a reflective material, and wherein the thermally conductive support comprises a heat sink.

12. The light generating device according to claim 1, wherein the thermally conductive support is light transmissive for one or more wavelengths of the first radiation and the luminescent material light.

13. A lamp or a luminaire or a projector device comprising the light generating device according to claim 12.

14. The light generating device according to claim 1, wherein the plurality of element bodies have first faces and second faces defining a body height, wherein the second faces are directed to the thermally conductive support, wherein differences in body height are within 5% from an average height, wherein the first faces defined a total first face area At, wherein the first bodies define k % of the total first face area At and wherein the second bodies defined 100-k % of the total first face area At, wherein $20 \leq k \leq 80$.

15. The light generating device according to claim 1, wherein the luminescent element and the light source are configured in a reflective mode, and wherein in an operational mode the light generating device is configured to generate white device light having a CRI of at least 85, wherein the device light comprises the first radiation and the luminescent material light, wherein the first radiation comprises blue light.

* * * * *